(12) United States Patent
Chen et al.

(10) Patent No.: US 11,846,802 B2
(45) Date of Patent: Dec. 19, 2023

(54) SEMICONDUCTOR STRUCTURE

(71) Applicant: Taiwan Semiconductor Manufacturing Company, Ltd., Hsinchu (TW)

(72) Inventors: Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/735,115

(22) Filed: May 3, 2022

(65) Prior Publication Data

US 2022/0260776 A1  Aug. 18, 2022

Related U.S. Application Data

(62) Division of application No. 16/836,932, filed on Apr. 1, 2020, now Pat. No. 11,347,001.

(51) Int. Cl.
| | |
|---|---|
| G02B 6/12 | (2006.01) |
| H01L 23/538 | (2006.01) |
| H01L 23/31 | (2006.01) |
| G02B 6/42 | (2006.01) |

(52) U.S. Cl.
CPC ....... *G02B 6/12002* (2013.01); *G02B 6/4295* (2013.01); *H01L 23/31* (2013.01); *H01L 23/5386* (2013.01)

(58) Field of Classification Search
CPC ... G02B 6/12002; G02B 6/4295; H01L 23/31; H01L 23/5386
See application file for complete search history.

(56) References Cited

U.S. PATENT DOCUMENTS

| | | | | |
|---|---|---|---|---|
| 7,352,066 | B2* | 4/2008 | Budd | G02B 6/43 |
| | | | | 257/E21.597 |
| 8,111,730 | B2* | 2/2012 | Budd | H01L 27/1446 |
| | | | | 372/50.23 |
| 8,148,264 | B2* | 4/2012 | Henry | H01L 21/3065 |
| | | | | 438/668 |
| 8,411,719 | B2* | 4/2013 | Budd | G02B 6/4206 |
| | | | | 372/50.23 |

(Continued)

OTHER PUBLICATIONS

Elbersen et al., Fabrication and Doping Methods for Silicon Nano- and Micropillar Arrays for Solar-Cell Applications: A Review, First published: Oct. 5, 2015, https://doi.org/10.1002/adma.201502632 (Year: 2015).*

(Continued)

*Primary Examiner* — Peter Radkowski
(74) *Attorney, Agent, or Firm* — JCIPRNET

(57) ABSTRACT

A structure adapted to optical coupled to an optical fiber includes a photoelectric integrated circuit die, an electric integrated circuit die, a waveguide die and an insulating encapsulant. The electric integrated circuit die is over and electrically connected to the photoelectric integrated circuit die. The waveguide die is over and optically coupled to the photoelectric integrated circuit die, wherein the waveguide die includes a plurality of semiconductor pillar portions extending from the optical fiber to the photoelectric integrated circuit die. The insulating encapsulant laterally encapsulates the electric integrated circuit die and the waveguide die.

20 Claims, 26 Drawing Sheets

(56) References Cited

U.S. PATENT DOCUMENTS

| | | | | |
|---|---|---|---|---|
| 8,483,253 | B2* | 7/2013 | Budd | G02B 6/428 |
| | | | | 372/50.23 |
| 8,557,612 | B2* | 10/2013 | Henry | H01L 21/3081 |
| | | | | 438/735 |
| 8,557,613 | B2* | 10/2013 | Shearn | H01L 21/3081 |
| | | | | 977/749 |
| 8,993,380 | B2 | 3/2015 | Hou et al. | |
| 9,000,584 | B2 | 4/2015 | Lin et al. | |
| 9,005,548 | B2* | 4/2015 | Henry | B01J 19/0046 |
| | | | | 422/551 |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,091,827 | B2* | 7/2015 | Verslegers | G02B 6/34 |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,299,649 | B2 | 3/2016 | Chiu et al. | |
| 9,368,460 | B2 | 6/2016 | Yu et al. | |
| 9,372,206 | B2 | 6/2016 | Wu et al. | |
| 9,390,936 | B2* | 7/2016 | Henry | B81C 1/00111 |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,570,883 | B2* | 2/2017 | Zarbock | G02B 6/4269 |
| 9,610,580 | B2* | 4/2017 | Wang | B41F 5/24 |
| 9,666,502 | B2 | 5/2017 | Chen et al. | |
| 9,666,559 | B2* | 5/2017 | Wang | B81C 1/0023 |
| 9,735,131 | B2 | 8/2017 | Su et al. | |
| 9,768,145 | B2* | 9/2017 | Yu | H01L 24/03 |
| 9,875,911 | B2* | 1/2018 | Pagaila | H01L 25/105 |
| 9,902,610 | B2* | 2/2018 | Chen | H04R 19/04 |
| 10,267,988 | B2* | 4/2019 | Huang | G02B 6/43 |
| 10,276,402 | B2* | 4/2019 | Chen | H01L 21/4846 |
| 10,297,832 | B2* | 5/2019 | Unnikrishnan | H01M 4/0452 |
| 10,355,302 | B2* | 7/2019 | Lethien | B81C 1/00111 |
| 10,461,022 | B2* | 10/2019 | Wu | H01L 23/5226 |
| 10,562,759 | B2* | 2/2020 | Chen | H04R 19/04 |
| 10,562,760 | B2* | 2/2020 | Chen | H04R 19/04 |
| 10,923,724 | B2* | 2/2021 | Schoo | H01M 10/0525 |
| 10,961,113 | B2* | 3/2021 | Chen | H04R 19/005 |
| 2007/0085215 | A1* | 4/2007 | Budd | G02B 6/43 |
| | | | | 257/778 |
| 2010/0213579 | A1* | 8/2010 | Henry | B01J 19/0046 |
| | | | | 438/719 |
| 2010/0215543 | A1* | 8/2010 | Henry | B81C 1/00111 |
| | | | | 430/296 |
| 2011/0020960 | A1* | 1/2011 | Henry | B81C 1/00031 |
| | | | | 257/E21.529 |
| 2011/0036396 | A1* | 2/2011 | Jayaraman | H01L 29/125 |
| | | | | 438/66 |
| 2011/0044367 | A1* | 2/2011 | Budd | H01L 27/1446 |
| | | | | 257/E31.127 |
| 2011/0068459 | A1* | 3/2011 | Pagaila | H01L 24/92 |
| | | | | 257/E23.141 |
| 2011/0135814 | A1* | 6/2011 | Miyauchi | C12M 25/06 |
| | | | | 264/291 |
| 2012/0120976 | A1* | 5/2012 | Budd | H01L 27/1446 |
| | | | | 257/E33.056 |
| 2012/0120978 | A1* | 5/2012 | Budd | G02B 6/4201 |
| | | | | 257/E31.127 |
| 2012/0264237 | A1* | 10/2012 | Shearn | B81C 1/00111 |
| | | | | 257/E21.53 |
| 2013/0230274 | A1* | 9/2013 | Fish | G02B 6/305 |
| | | | | 385/14 |
| 2014/0010498 | A1* | 1/2014 | Verslegers | G02B 6/30 |
| | | | | 385/37 |
| 2014/0029639 | A1* | 1/2014 | Zarbock | G02B 6/4269 |
| | | | | 372/50.1 |
| 2014/0269804 | A1* | 9/2014 | Lai | H01S 5/02355 |
| | | | | 372/50.21 |
| 2014/0352382 | A1* | 12/2014 | Wang | B41F 5/24 |
| | | | | 428/209 |
| 2015/0050746 | A1* | 2/2015 | Henry | H01L 21/3086 |
| | | | | 430/296 |
| 2016/0071818 | A1* | 3/2016 | Wang | H01L 24/49 |
| | | | | 257/773 |
| 2016/0240882 | A1* | 8/2016 | Lethien | H01M 10/02 |
| 2016/0280537 | A1* | 9/2016 | Henry | B81C 1/00111 |
| 2016/0332865 | A1* | 11/2016 | Chen | B81B 3/0054 |
| 2016/0343513 | A1* | 11/2016 | Kinge | H01G 9/209 |
| 2017/0062383 | A1* | 3/2017 | Yee | H01L 23/3675 |
| 2017/0062390 | A1* | 3/2017 | Chua | H01L 21/561 |
| 2017/0108655 | A1* | 4/2017 | Zarbock | G02B 6/4238 |
| 2017/0271248 | A1* | 9/2017 | Chen | H01L 23/5389 |
| 2017/0313575 | A1* | 11/2017 | Chen | B81B 3/0054 |
| 2017/0313576 | A1* | 11/2017 | Chen | B81C 1/00246 |
| 2017/0317356 | A1* | 11/2017 | Unnikrishnan | C09D 11/52 |
| 2017/0355592 | A1* | 12/2017 | Chen | H04R 19/005 |
| 2018/0159133 | A1* | 6/2018 | Schoo | H01G 9/209 |
| 2019/0004247 | A1* | 1/2019 | Huang | G02B 6/4214 |
| 2019/0057932 | A1* | 2/2019 | Wu | H01L 23/04 |
| 2019/0317287 | A1* | 10/2019 | Raghunathan | G02B 6/4274 |

OTHER PUBLICATIONS

Shao T, Tang F, Sun L, Ye X, He J, Yang L, Zheng W. Fabrication of Antireflective Nanostructures on a Transmission Grating Surface Using a One-Step Self-Masking Method. Nanomaterials. 2019; 9(2):180. https://doi.org/10.3390/nano9020180 (Year: 2019).*

* cited by examiner ically illustrating a process flow for fabricating a package in accordance with some embodiments of the present disclosure. FIGS. 3B, 4B and 5B are enlarged views of the region X illustrated in FIGS. 3A, 4A and 5A, respectively, in accordance with some embodiments of the present disclosure.

FIG. 13 is a cross-sectional view schematically illustrating a package in accordance with some other embodiments of the present disclosure.

FIG. 14 is a cross-sectional view schematically illustrating a package in accordance with some other embodiments of the present disclosure.

FIGS. 15 through 18 are cross-sectional views schematically illustrating a process flow for fabricating a package in accordance with some other embodiments of the present disclosure.

SEMICONDUCTOR STRUCTURE

CROSS-REFERENCE TO RELATED APPLICATION

This application is a divisional application of and claims the priority benefit of U.S. application Ser. No. 16/836,932, filed on Apr. 1, 2020, now allowed. The entirety of the above-mentioned patent application is hereby incorporated by reference herein and made a part of this specification.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
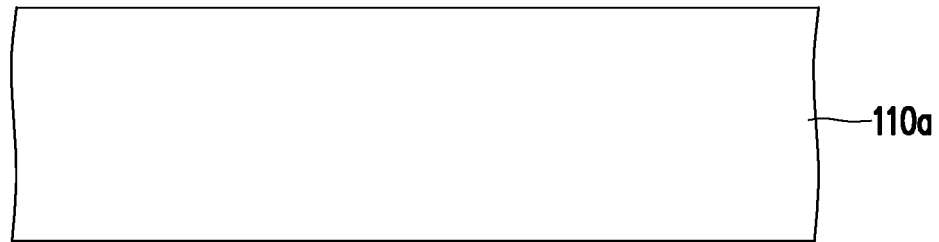
FIGS. 1A through 1G are various views schematically illustrating a process flow for fabricating waveguide dies in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A through 1G are various views schematically illustrating a process flow for fabricating waveguide dies 100A in accordance with some embodiments of the present disclosure. Referring to FIG. 1A, a semiconductor substrate 110a is provided. For example, the semiconductor substrate 110a may be or may include a bulk silicon substrate, a silicon germanium substrate, or a substrate formed of other semiconductor materials.

Figure 1B:
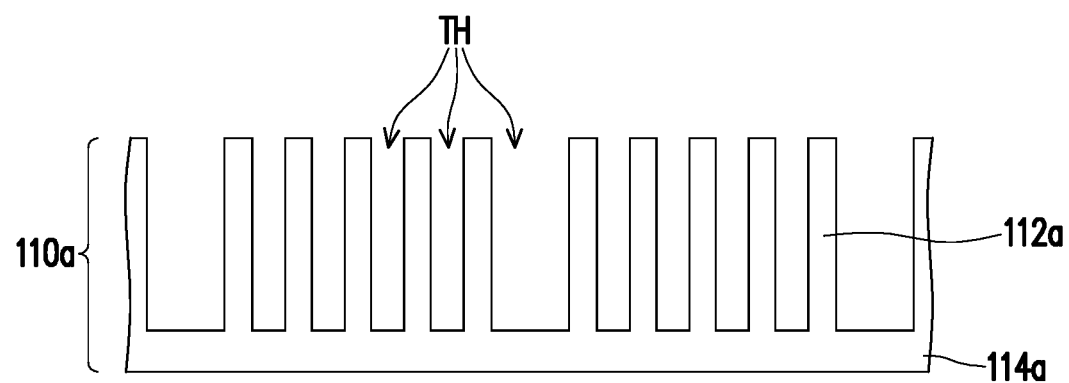

Referring to FIG. 1A and FIG. 1B, the semiconductor substrate 110a is patterned to form a plurality of semiconductor pillar portions 112a in the semiconductor substrate 110a. In some embodiments, the semiconductor substrate 110a is patterned by photolithograph/etching process or other suitable patterning processes. As illustrated in FIG. 1B, a plurality of trenches TH having a predetermined depth are formed in semiconductor substrate 110a, such that a semiconductor base portion 114a and the semiconductor pillar portions 112a protruding from the semiconductor base portion 114a are formed.

Figure 1C:
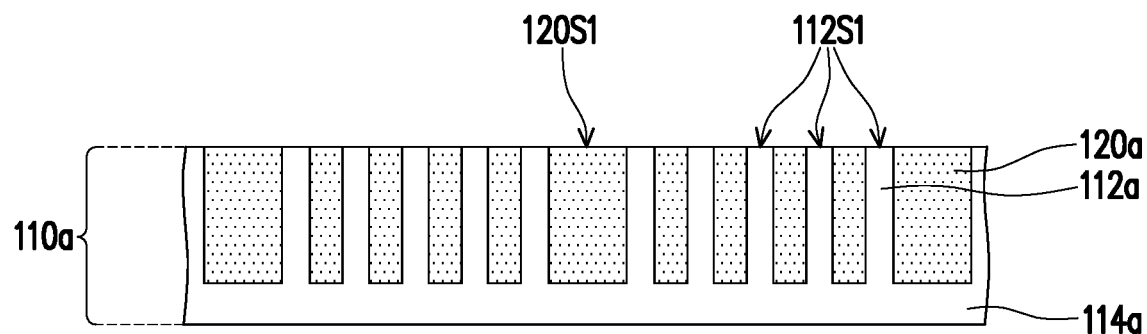

Referring to FIG. 1B and FIG. 1C, a dielectric layer 120a is formed over the semiconductor substrate 110a to fill the trenches TH between the semiconductor pillar portions 112a. The formation process of the dielectric layer 120a may be attained by the following steps. First, a dielectric material (not shown) is formed on the semiconductor substrate 110a to cover the semiconductor pillar portions 112a. In some embodiments, the dielectric material may entirely cover a top surface of the semiconductor substrate 110a and entirely fill the trenches TH. In some embodiments, the dielectric material may be formed by spin coating, chemical vapor deposition (CVD), plasma-enhanced chemical vapor deposition (PECVD), lamination or the like. Thereafter, portions of the dielectric material outside the trenches TH are ground to reveal the semiconductor pillar portions 112a, so as to form the dielectric layer 120a. In some embodiments, the portions of the dielectric material outside the trenches TH are removed by a mechanical grinding process, a chemical mechanical polishing (CMP) process, or other suitable processes. In some embodiments, portions of the semiconductor pillar portions 112a are ground as well. After the grinding process, a first surface 120S1 of the dielectric layer 120a facing upward is substantially leveled with the first surfaces 112S1 of the semiconductor pillar portions 112a facing upward. In some embodiments, a material of the dielectric layer 120a may include silicon oxide ($SiO_x$, where x>0), silicon nitride ($SiN_x$, where x>0), silicon oxynitirde ($Si-O_xN_y$, where x>0 and y>0) or other suitable dielectric materials.

Figure 1D:
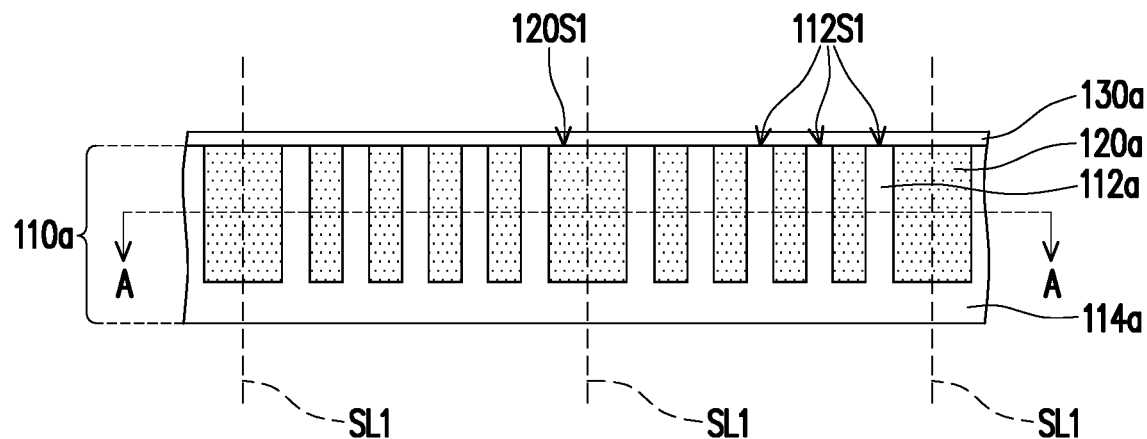

Referring to FIG. 1C and FIG. 1D, a bonding layer 130a is formed on the semiconductor pillar portions 112a and the dielectric layer 120a to cover the first surfaces 112S1 of the semiconductor pillar portions 112a and the first surface 120S1 of the dielectric layer 120a. In some embodiments, the bonding layer 130a may be formed by spin coating, chemical vapor deposition (CVD), plasma-enhanced chemical vapor deposition (PECVD), lamination or the like. In some embodiments, a planarization process, such as a chemical mechanical polishing (CMP) process, is optionally performed on the bonding layer 130a. In some embodiments, a material of the bonding layer 130a may include silicon oxide, silicon nitride, silicon oxynitirde or other suitable dielectric materials.

Figure 1E:
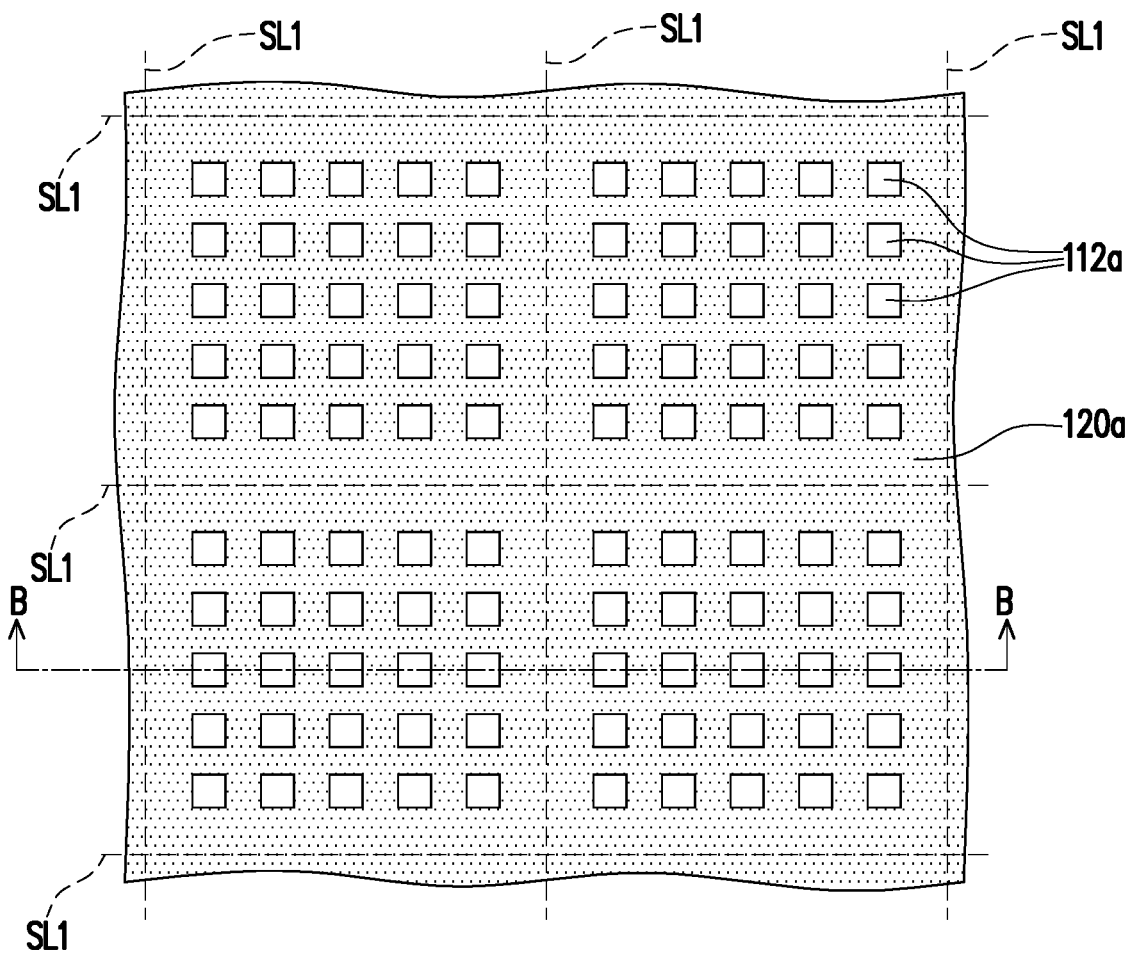
Figure 1F:
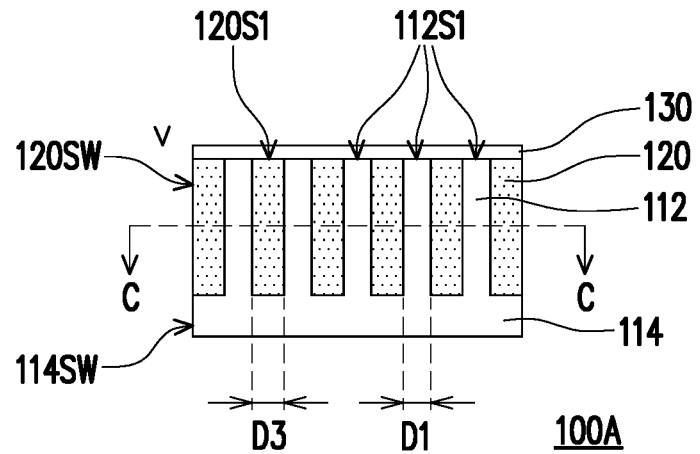
Figure 1G:
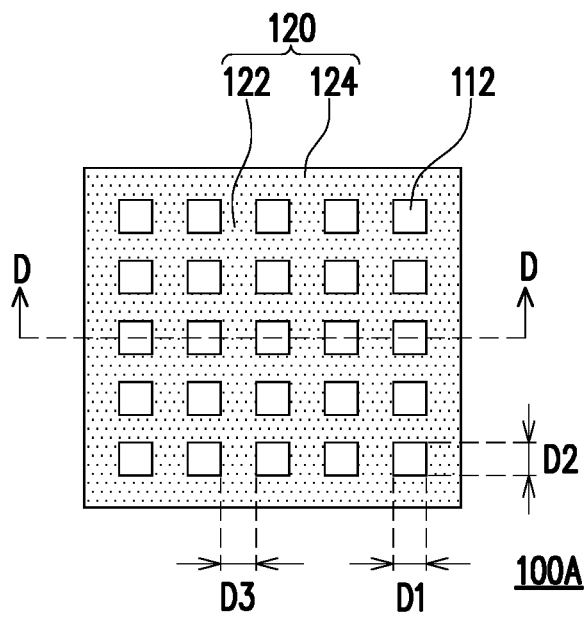

FIG. 1E is a cross-sectional view of the structure in FIG. 1D along cross-section A-A in accordance with some embodiments of the present disclosure. FIG. 1D is a cross-sectional view of the structure in FIG. 1E along the cross-section B-B. FIG. 1G is a cross-sectional view of the waveguide die in FIG. 1F along cross-section C-C in accordance with some embodiments of the present disclosure. FIG. 1F is a cross-sectional view of the waveguide die in FIG. 1G along the cross-section D-D.

Referring to FIG. 1D through FIG. 1G, a sawing process is performed along a scribe line SL1 to singulate the semiconductor substrate 110a, the dielectric layer 120a and the bonding layer 130a. The semiconductor substrate 110a, the dielectric layer 120a and the bonding layer 130a are singulated into a plurality of waveguide dies 100A. As illustrated in FIG. 1F, each singulated waveguide die 100A includes a plurality of the semiconductor pillar portions 112, a semiconductor base portion 114, a dielectric layer 120 and a bonding layer 130. The semiconductor pillar portions 112 protrude from the semiconductor base portion 114 and are embedded in the dielectric layer 120. The bonding layer 130 covers the first surfaces 112S1 of the semiconductor pillar portions 112 and the first surface 120S1 of the dielectric layer 120. As shown in FIG. 1D and FIG. 1F, the materials and the characteristics of the semiconductor pillar portions 112, the semiconductor base portion 114, the dielectric layer 120 and the bonding layer 130 in FIG. 1F are the same as those of the semiconductor pillar portions 112a, the semiconductor base portion 114a, the dielectric layer 120a and the bonding layer 130a in FIG. 1D, and the detailed descriptions are omitted therein.

In some embodiments, the dielectric layer 120 includes a material having a refractive index lower than that of the semiconductor pillar portions 112. For example, in an embodiment where the material of the dielectric layer 120 includes silicon oxide and the material of the semiconductor pillar portions 112 includes silicon, the refractive index of the dielectric layer 120 is about 1.4 and the refractive index of the semiconductor pillar portions 112 is about 3.5. When a radiation is incident into the semiconductor pillar portions 112, the incident radiation may be totally internally reflected at the sidewalls of the semiconductor pillar portions 112, such that the semiconductor pillar portions 112 of the waveguide die 100A may be used to guide a light from one end of the semiconductor pillar portions 112 toward another end of the semiconductor pillar portions 112. The details will be discussed later.

As illustrated in FIG. 1D and FIG. 1E, portions of the dielectric layer 120a and portions of the semiconductor base portion 114a are located in the scribe line regions (the regions of the scribe line SL1). Therefore, as illustrated in FIG. 1F and FIG. 1G, a sidewall 120SW of the dielectric layer 120 is substantially aligned with a sidewall 114SW of the semiconductor base portion 114 after the sawing process is performed along the scribe line SL1.

Referring to FIG. 1F and FIG. 1G again, the semiconductor pillar portions 112 may be arranged in array. In some embodiments, the semiconductor pillar portions 112 from the top view may be respectively shaped as square patterns. In some alternative embodiments, the semiconductor pillar portions of the waveguide die from the top view may be respectively shaped as rectangular patterns or circular patterns. The disclosure does not construe the shape of the semiconductor pillar portions of the waveguide die. As illustrated in FIG. 1G, the dielectric layer 120 may include a mesh portion 122 and a ring portion 124. The semiconductor pillar portions 112 may be spaced apart from each other by the mesh portion 122 of the dielectric layer 120, and the semiconductor pillar portions 112 may be encircled by the ring portion 124 of the dielectric layer 120.

In some embodiments, the semiconductor pillar portion 112 may have a width D1 and a length D2. In some embodiments, the width D1 and the length D2 of the semiconductor pillar portion 112 may be the same. In some embodiments, the width D1 and the length D2 of the semiconductor pillar portion 112 may be different. For example, the length D2 of the semiconductor pillar portion 112 may be about 2 times the width D1 of the semiconductor pillar portion 112. In some embodiments, the width D1 and/or the length D2 of the semiconductor pillar portion 112 may range from about 0.1 micrometer to about 0.2 micrometer, for example. In some embodiments, the semiconductor pillar portions 112 are spaced apart from one another by a distance D3 ranging from about 0.5 micrometer to about 2 micrometers, for example.

Figure 2A:
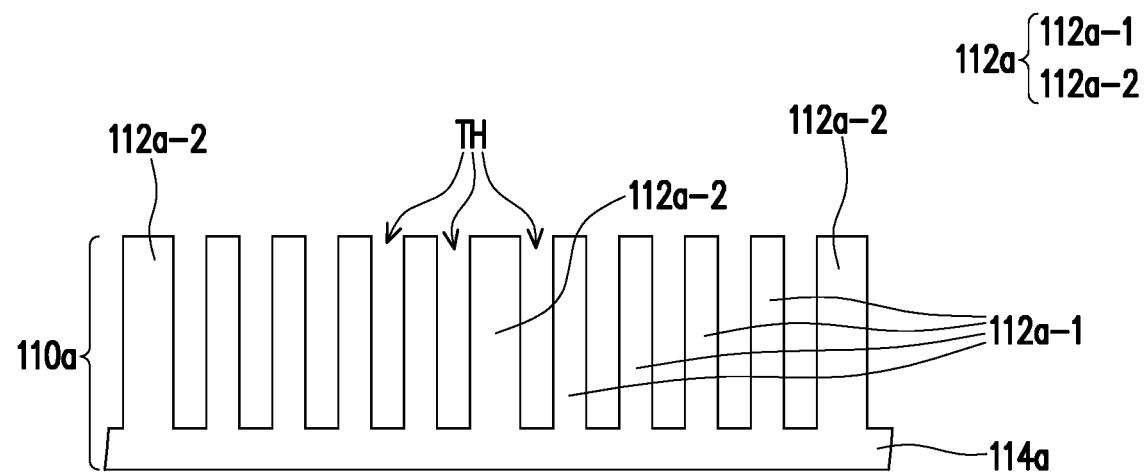
FIGS. 2A through 2E are various views schematically illustrating a process flow for fabricating waveguide dies 100B in accordance with some other embodiments of the present disclosure.
Figure 2B:
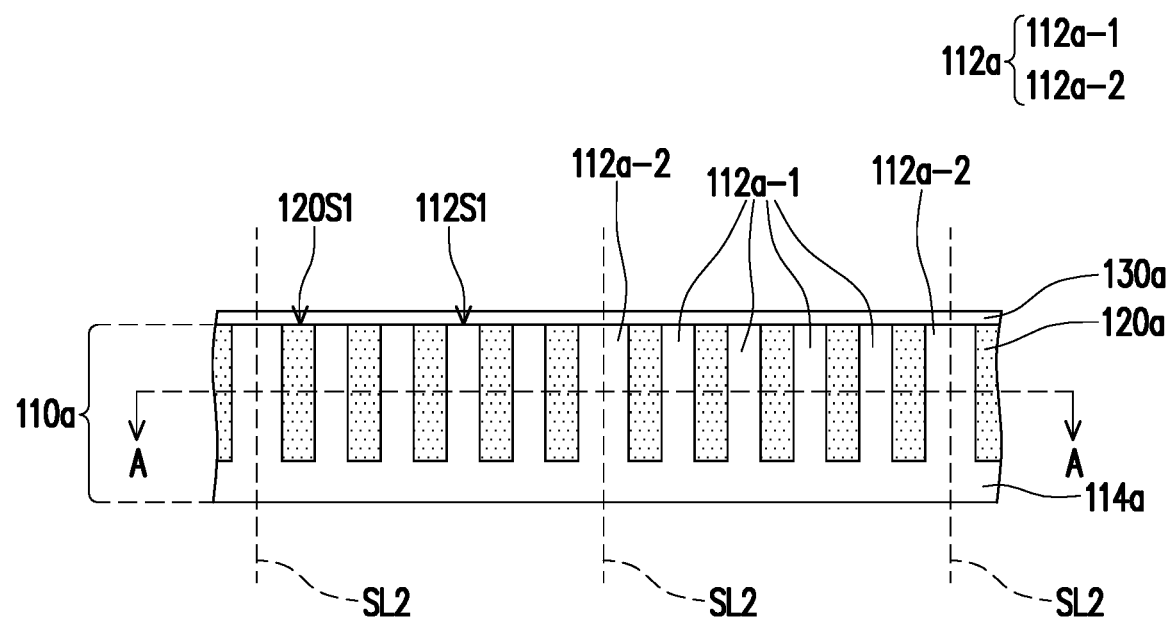
Figure 2C:
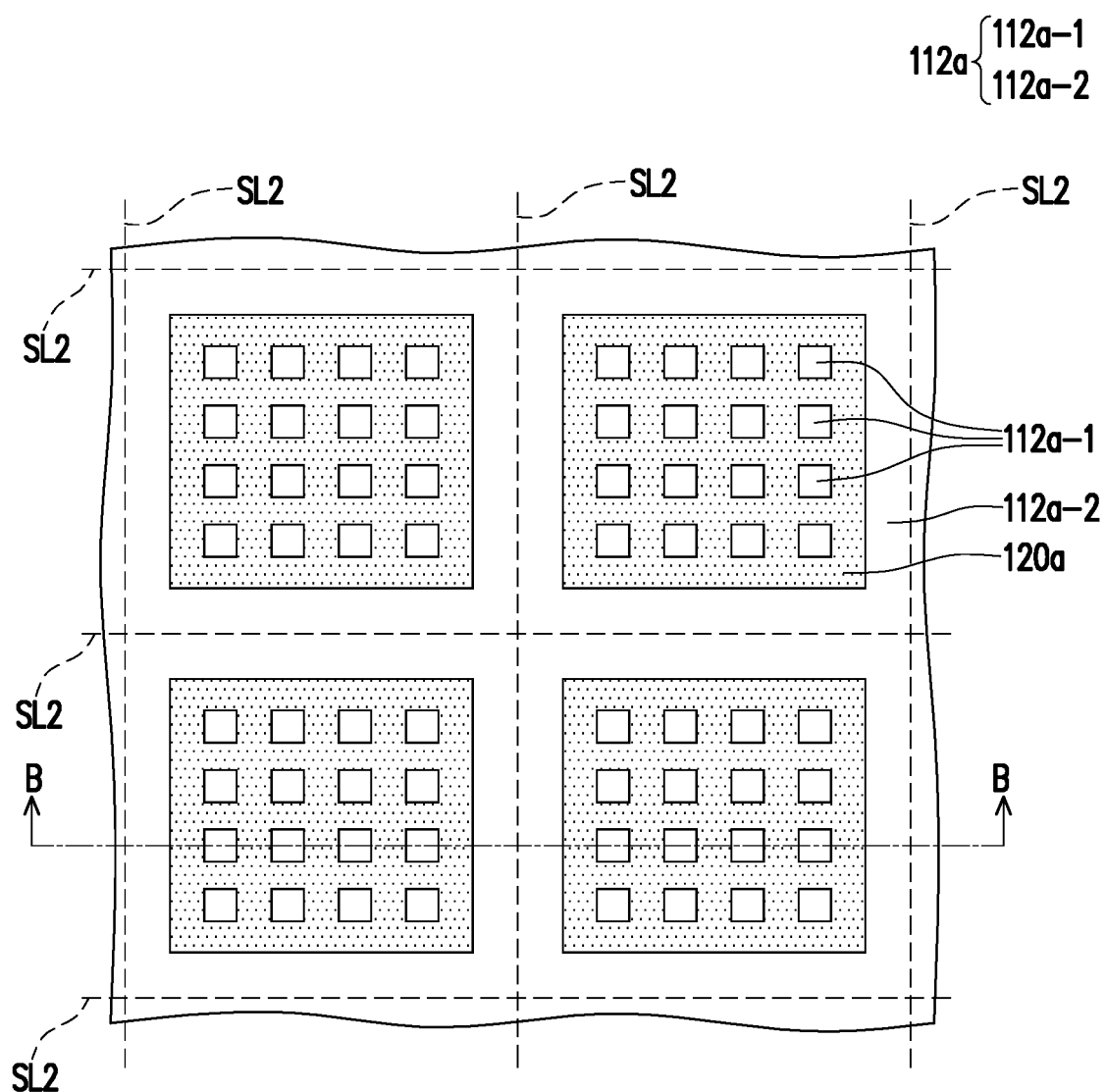
Figure 2D:
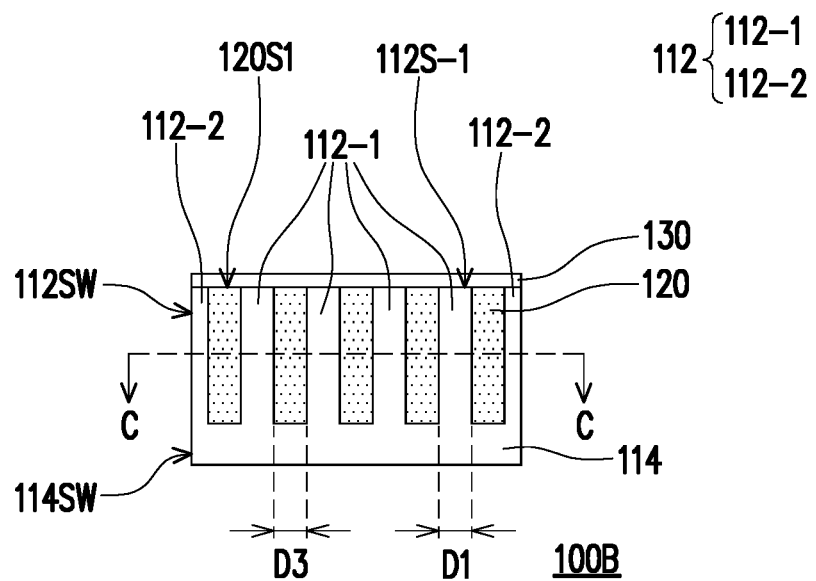
Figure 2E:
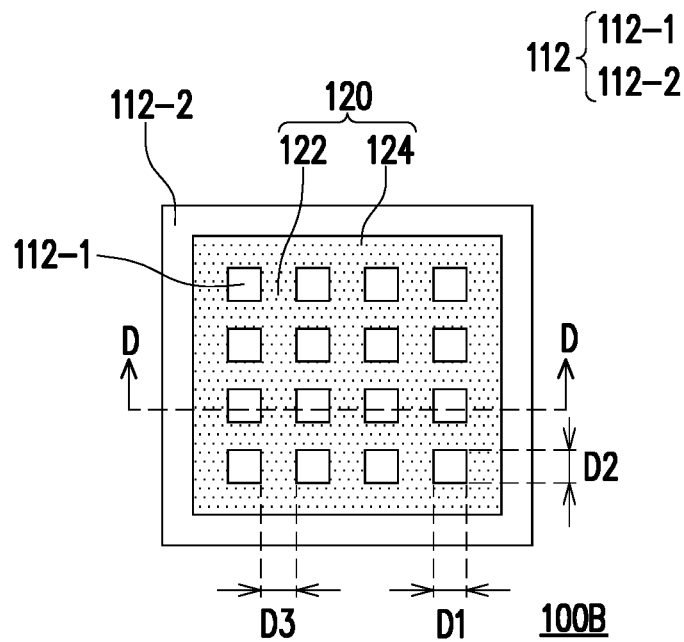

FIGS. 2A through 2E are various views schematically illustrating a process flow for fabricating waveguide dies 100B in accordance with some other embodiments of the present disclosure. FIG. 2C is a cross-sectional view of the structure in FIG. 2B along cross-section A-A in accordance with some embodiments of the present disclosure. FIG. 2B is a cross-sectional view of structure in FIG. 2C along the cross-section B-B. FIG. 2E is a cross-sectional view of the waveguide die in FIG. 2D along cross-section C-C in accordance with some embodiments of the present disclosure. FIG. 2D is a cross-sectional view of the waveguide die in FIG. 2E along the cross-section D-D.

The process flow shown in FIGS. 2A-2E is similar to the process flow shown in FIGS. 1A-1F, and the waveguide dies 100B shown in FIGS. 2D and 2E are similar to the waveguide dies 100A shown in FIGS. 1F and 1G, and the detailed descriptions are omitted for the sake of brevity. In some embodiments, the semiconductor pillar portions 112 of the waveguide dies 100B include a plurality of first semiconductor pillar portions 112-1 arranged in array and a second semiconductor pillar portion 112-2 encircling the first semiconductor pillar portions 112-1, wherein the first semiconductor pillar portions 112-1 are embedded in the dielectric layer 120 and are spaced apart from the second semiconductor pillar portion 112-2 by the dielectric layer 120.

Referring to FIG. 2A, a semiconductor substrate 100a is provided, and the semiconductor substrate 110a is patterned to form a plurality of semiconductor pillar portions 112a in the semiconductor substrate 110a. The semiconductor pillar portions 112a include a plurality of first semiconductor pillar portions 112a-1 arranged in array and a second semiconductor pillar portion 112a-2 encircling the first semiconductor pillar portions 112a-1.

Referring to FIG. 2A and FIG. 2B, a dielectric layer 120a is formed over the semiconductor substrate 110a to fill the trenches TH between the semiconductor pillar portions 112a. Thereafter, a bonding layer 130a is formed on the semiconductor pillar portions 112a and the dielectric layer 120a to cover the first surfaces 112S1 of the semiconductor pillar portions 112a and the first surface 120S1 of the dielectric layer 120a.

Referring to FIG. 2B through FIG. 2D, a sawing process is performed along a scribe line SL2 to singulate the semiconductor substrate 110a, the dielectric layer 120a and the bonding layer 130a. The semiconductor substrate 110a, the dielectric layer 120a and the bonding layer 130a are singulated into a plurality of waveguide dies 100B. As illustrated in FIG. 2D, each singulated waveguide die 100B includes the plurality of first semiconductor pillar portions 112-1, the second semiconductor pillar portions 112-2, the semiconductor base portion 114, the dielectric layer 120 and the bonding layer 130. The first semiconductor pillar portions 112-1, the second semiconductor pillar portions 112-2 protrude from the semiconductor base portion 114. The bonding layer 130 covers the first surfaces 112S1 of the semiconductor pillar portions 112 and the first surface 120S1 of the dielectric layer 120.

As illustrated in FIG. 2B and FIG. 2C, portions of the second semiconductor pillar portion 112a-2 and portions of the semiconductor base portion 114a are located in the scribe line regions (the regions of the scribe line SL2). Therefore, as illustrated in FIG. 2D and FIG. 2E, a sidewall 112SW of the second semiconductor pillar portion 112-2 is substantially aligned with a sidewall 114SW of the semiconductor base portion 114 after the sawing process is performed along the scribe line SL2. As illustrated in FIG. 2C, prior to the sawing process, the second semiconductor pillar portion 112a-2 from the top view may be shaped as a mesh pattern.

Referring to FIG. 2D and FIG. 2E again, the first semiconductor pillar portions 112-1 may be arranged in array. In some embodiments, the first semiconductor pillar portions 112-1 from the top view may be respectively shaped as square patterns. In some alternative embodiments, the first semiconductor pillar portions of the waveguide die from the top view may be respectively shaped as rectangular patterns or circular patterns. In some embodiments, the second semiconductor pillar portion 112-2 from the top view may be shaped as a square-frame pattern. In some alternative embodiments, the second semiconductor pillar portion of the waveguide die from the top view may be shaped as a rectangular-frame pattern or a circular-ring pattern. The disclosure does not construe the shape of the semiconductor pillar portions of the waveguide die. As illustrated in FIG. 2E, the dielectric layer 120 may include a mesh portion 122 and a ring portion 124. The first semiconductor pillar portions 112-1 may be spaced apart from each other by the mesh portion 122 of the dielectric layer 120, and the first semiconductor pillar portions 112-1 may be encircled by the ring portion 124 of the dielectric layer 120 and spaced apart from the second semiconductor pillar portions 112-2 by the ring portion 124 of the dielectric layer 120.

FIGS. 3A, 4A, 5A, 6 through 12 are cross-sectional views schematically illustrating a process flow for fabricating a package in accordance with some embodiments of the present disclosure. FIGS. 3B, 4B and 5B are enlarged views of the region X illustrated in FIGS. 3A, 4A and 5A, respectively, in accordance with some embodiments of the present disclosure. In some embodiments, one integrated circuit die is shown to represent plural integrated circuit die of the semiconductor wafer.

Figure 3A:
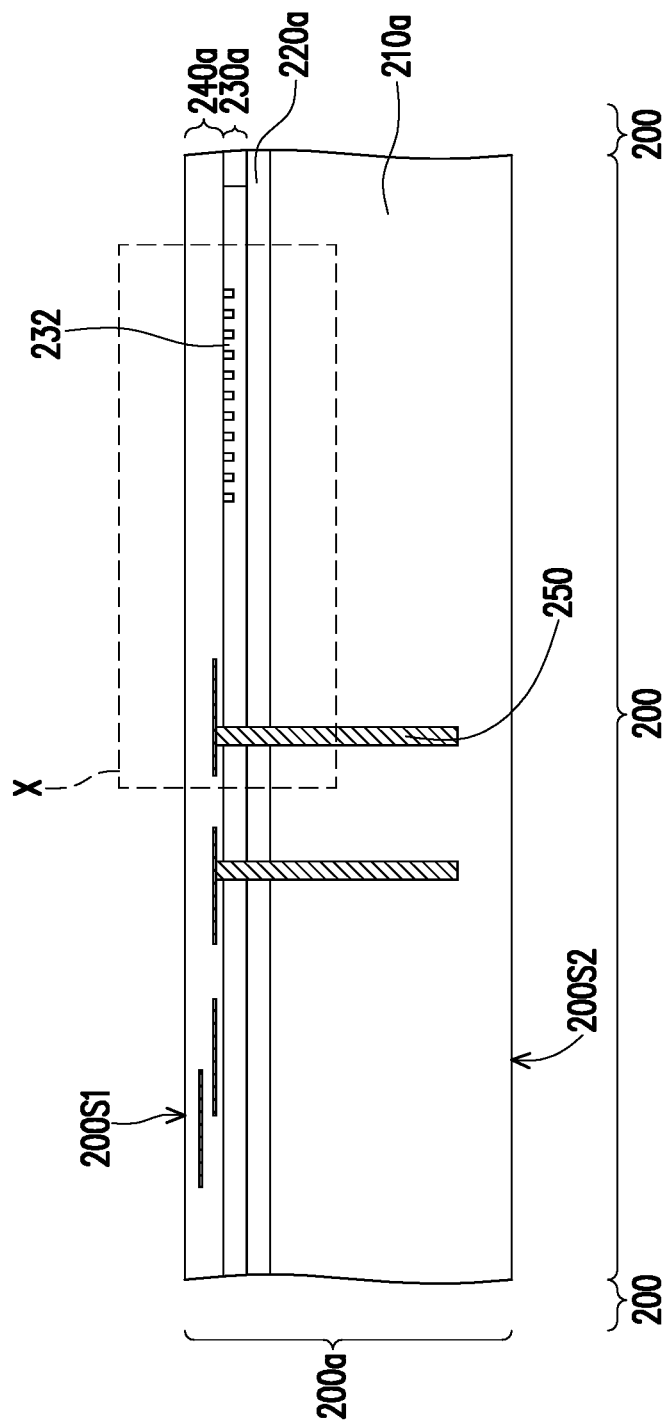
FIGS. 3A, 4A, 5A, 6 through 12 are cross-sectional views schematically illustrating a process flow for fabricating a package in accordance with some embodiments of the present disclosure.
Figure 3B:
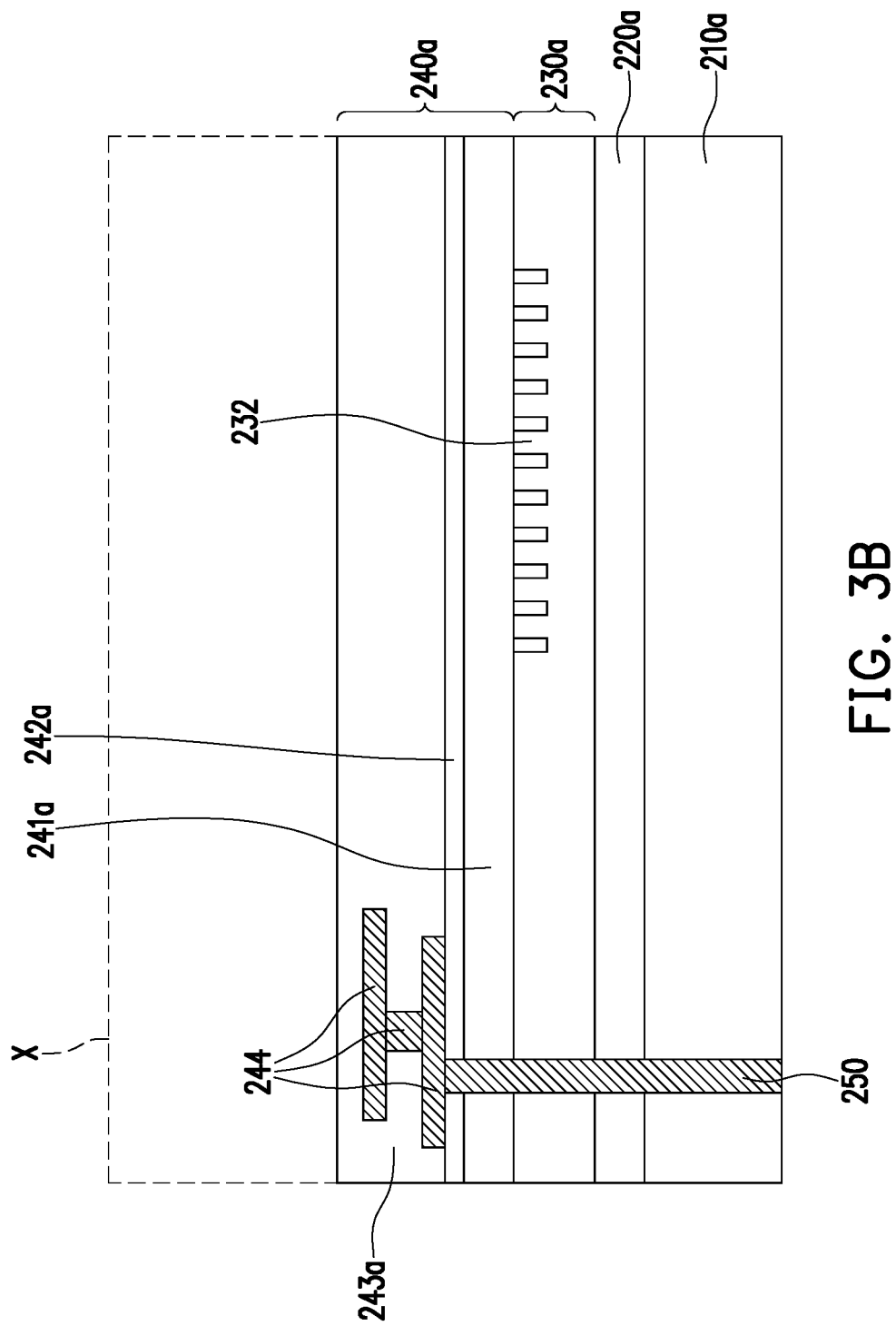
FIGS. 3B, 4B and 5B are enlarged views of the region X illustrated in FIGS. 3A, 4A and 5A, respectively, in accordance with some embodiments of the present disclosure.
Figure 12:
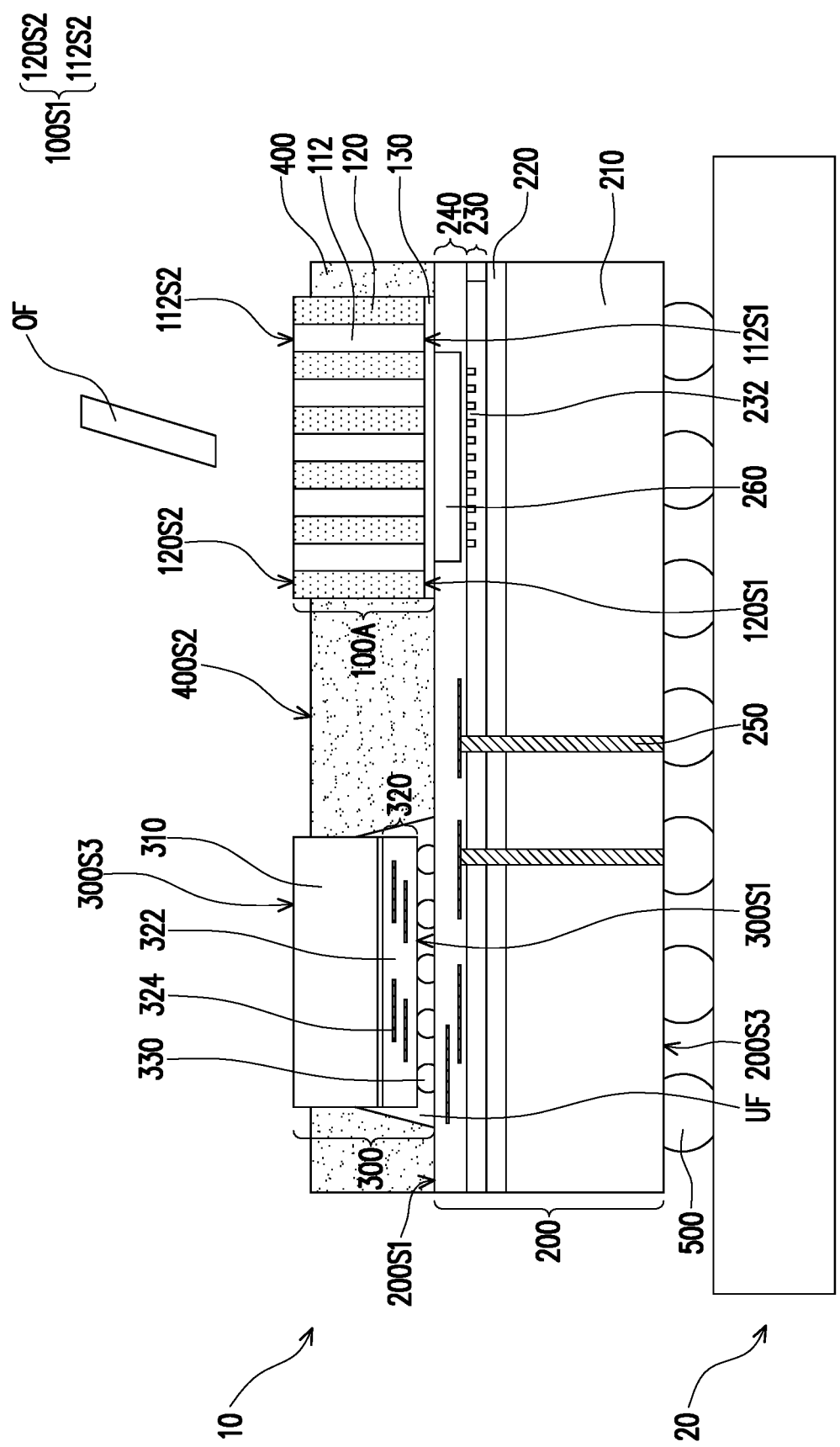

Referring to FIG. 3A and FIG. 3B, a semiconductor wafer 200a including a plurality of photoelectric integrated circuit dies 200 is provided. Before a wafer dicing process is performed on the semiconductor wafer 200a, the photoelectric integrated circuit dies 200 are connected to one another. In some embodiments, the semiconductor wafer 200a includes a semiconductor substrate 210a, a dielectric layer 220a and a waveguide layer 230a. In some embodiments, the semiconductor substrate 210a may be or may include a bulk silicon substrate, a silicon germanium substrate, or a substrate formed of other semiconductor materials. In some embodiments, the dielectric layer 220a is formed over the semiconductor substrate 210a, and a material of the dielectric layer 220a may include silicon oxide, silicon nitride, silicon oxynitirde or other suitable dielectric materials. In some embodiments, the waveguide layer 230a is formed over the dielectric layer 220a, and is configured for the internal transmission of optical signals. In some embodiments, the waveguide layer 230a includes waveguides (not individually illustrated) and a grating coupler 232 optically coupled to the waveguides. The grating coupler 232 may be configured to receive radiation from the overlying light source or optical signal source (such as the optical fiber OF as shown in FIG. 12), and transmit the radiation to waveguides. In some embodiments, materials of the waveguides and grating coupler 232 of the waveguide layer 230a may be or may include silicon, or other suitable semiconductor materials. In some embodiments, the photoelectric integrated circuit dies 200 in the semiconductor wafer 200a may include various devices and circuits (not shown) that may be used for processing and transmitting optical signals and/or electrical signals.

In some embodiments, the semiconductor wafer 200a further includes an interconnect structure 240a over the waveguide layer 230a and through semiconductor vias (TSVs) 250 electrically connected to the interconnect structure 240a. In some embodiments, the interconnect structure 240a includes a dielectric layer 241a, an etching stop layer 242a over the dielectric layer 241a, a dielectric layer 243a over the etching stop layer 242a, and interconnect wirings 244 embedded in the dielectric layer 243a. In some embodiments, the TSVs 250 may be formed in the semiconductor substrate 210a, the dielectric layer 220a, the waveguide layer 230a and the interconnect structure 240a. In some embodiments, a material of the dielectric layer 241a and/or the dielectric layer 243a may include silicon oxide, silicon nitride, silicon oxynitirde or other suitable dielectric materials. In some embodiments, the dielectric layer 243a and the etching stop layer 242a are made of different materials. For example, a material of the etching stop layer 242a may include silicon carbide, silicon nitride, SiCN, and SiOCN or other suitable dielectric materials. In some embodiments, the interconnect wirings 244 and/or the TSVs 250 may be formed of copper, copper alloys or other suitable conductive material.

As illustrated in FIG. 3A, the semiconductor wafer 200a includes a front surface (active surface) 200S1 and a rear surface 200S2 opposite to the front surface 200S1.

Figure 4A:
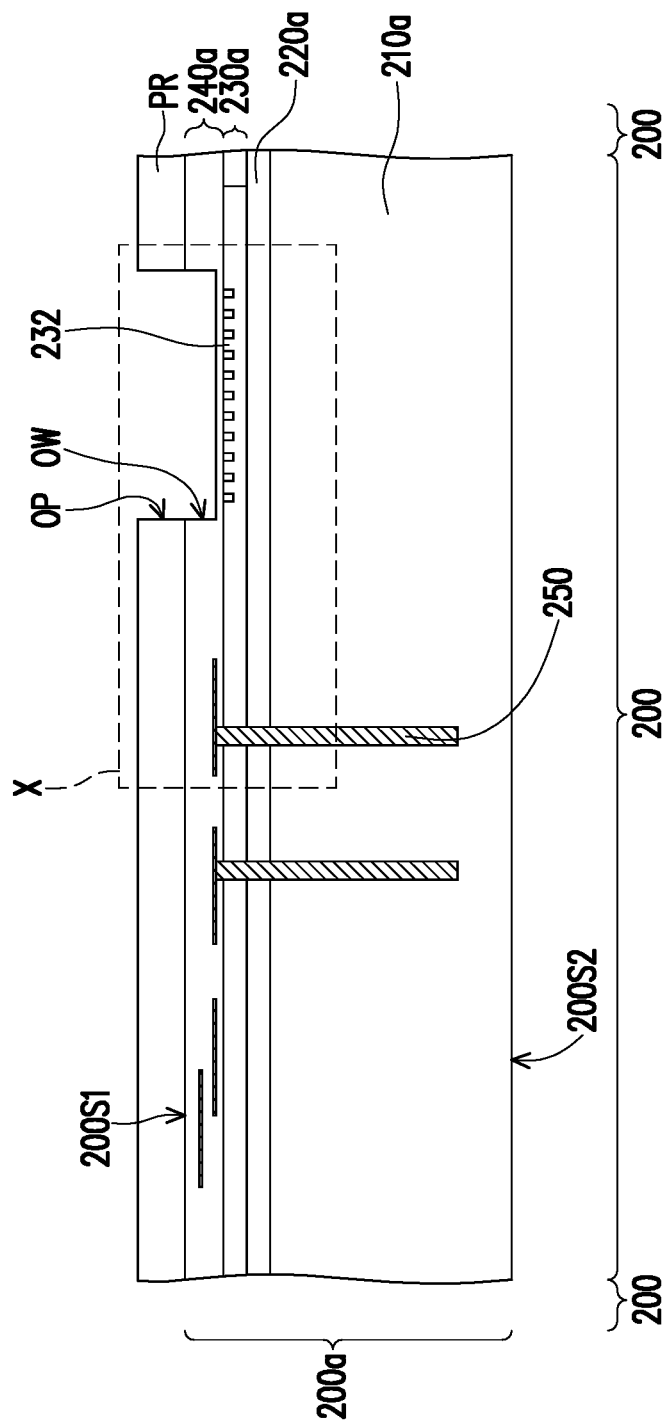
Figure 4B:
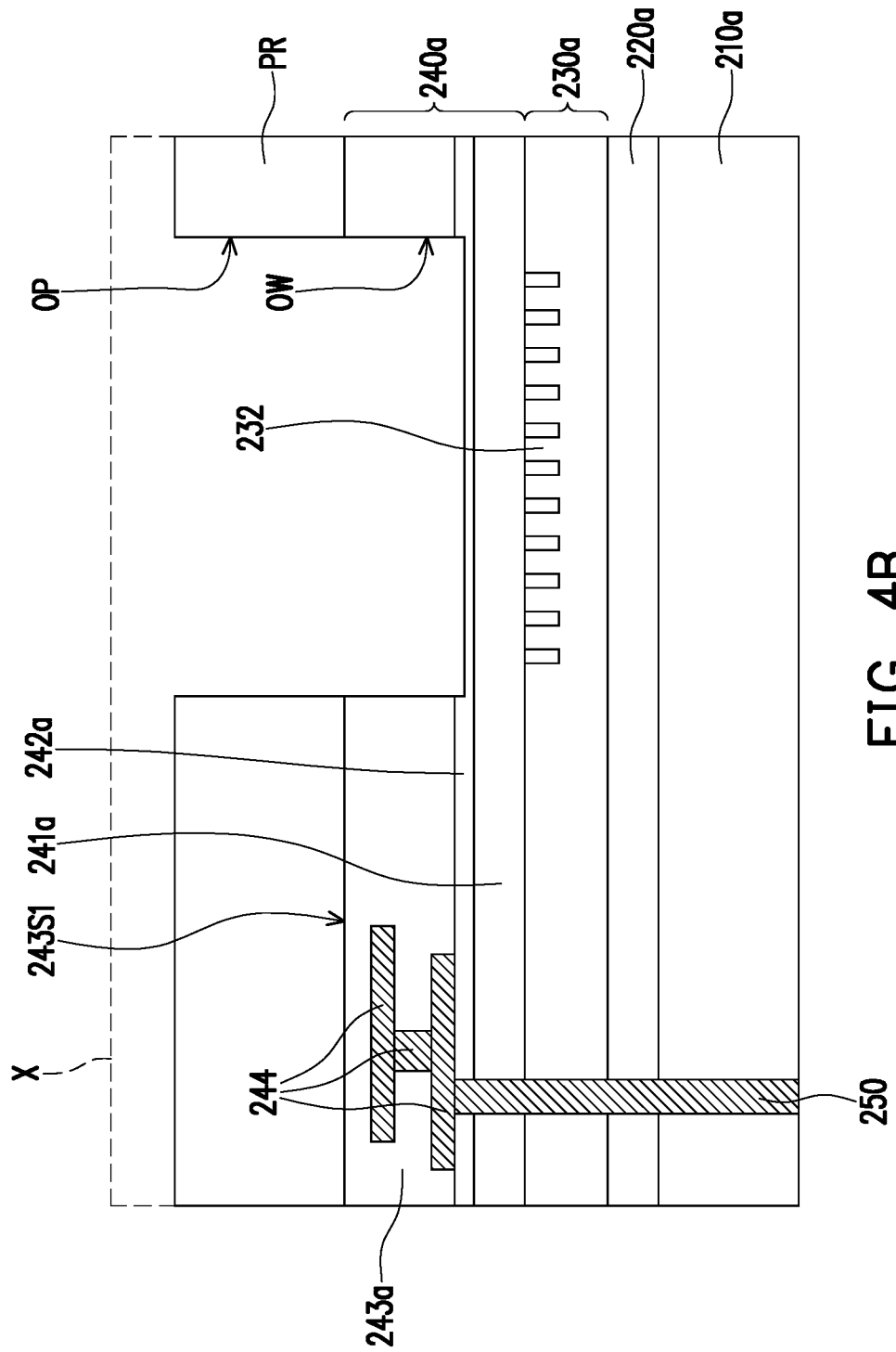

Referring to FIG. 4A and FIG. 4B, a patterned photoresist layer PR including an opening OP may be formed over the interconnect structure 240a to partially cover a top surface 243S1 of the dielectric layer 243a, wherein the top surface 243S1 of the dielectric layer 243a is partially exposed by the opening OP defined in the patterned photoresist layer PR. In some embodiments, the opening OP corresponds to the locations of the grating coupler 232 of the waveguide layer 230a. For example, vertical projections of the openings OP along a direction perpendicular to the front surface (active surface) 200S1 of the f semiconductor wafer 200a overlap with the grating coupler 232 of the waveguide layer 230a. Subsequently, an etching process may be performed by using the patterned photoresist layer PR as a mask, such that an optical window OW directly over the grating coupler 232 is formed in the dielectric layer 243a of the interconnect structure 240a. In some embodiments, the optical window OW may extend into the etching stop layer 242a. In some embodiments, the optical window OW may allow optical transmission between the photoelectric integrated circuit die 200 in the semiconductor wafer 200a and the external element (e.g., the waveguide die 100A/100B).

Figure 5A:
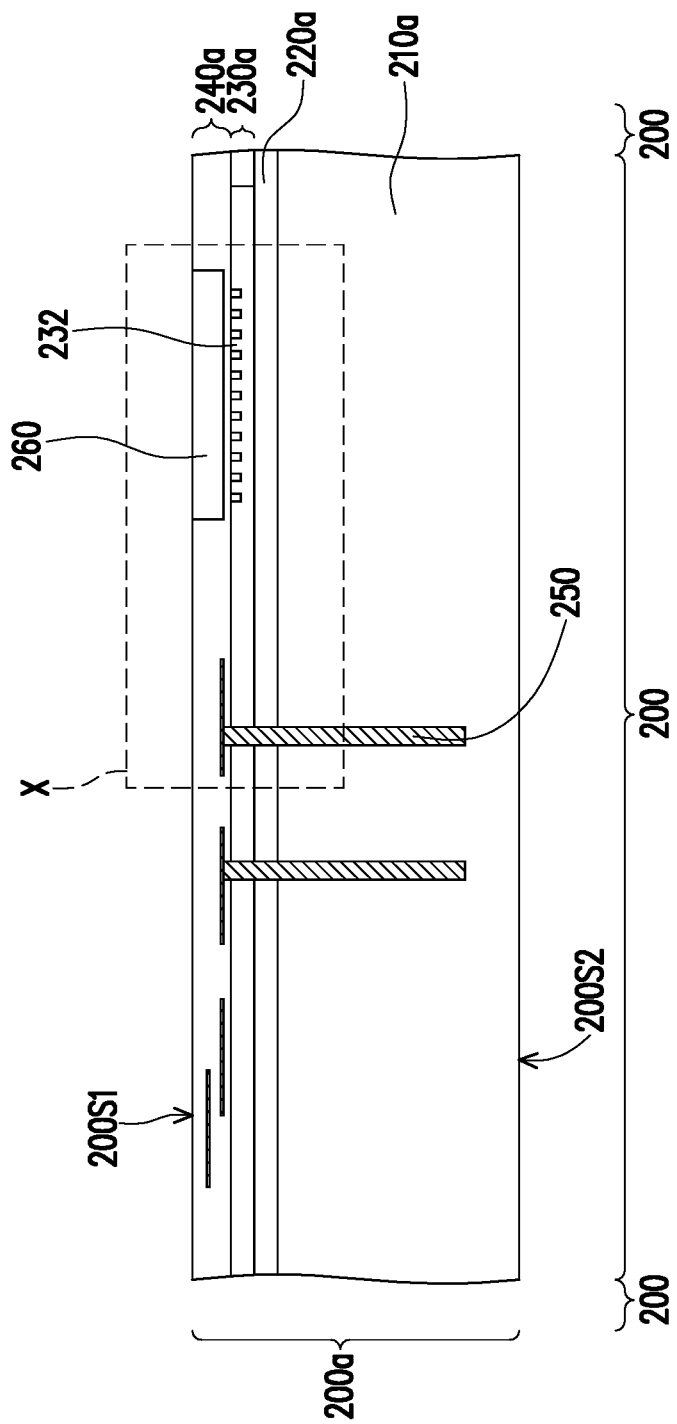
Figure 5B:
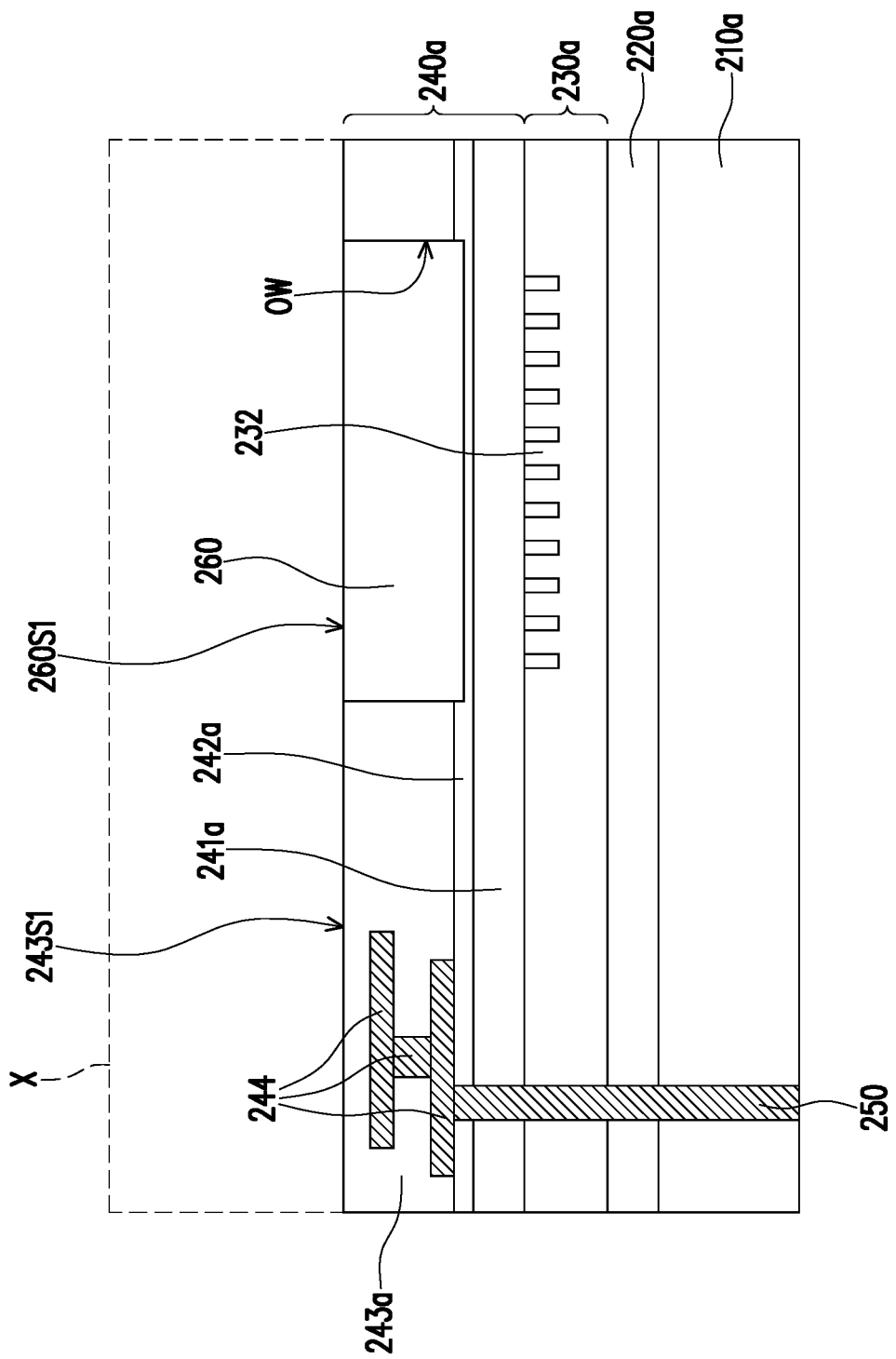

Referring to FIG. 5A and FIG. 5B, the patterned photoresist layer PR is removed/stripped through, for example, etching, ashing, or other suitable removal processes. Thereafter, a bonding material (not shown) is formed on the dielectric layer 243a to cover the dielectric layer 243a. In some embodiments, the bonding material may entirely cover a top surface 243S1 of the dielectric layer 243a and entirely fill the optical window OW. In some embodiments, the bonding material may be formed by spin coating, chemical vapor deposition (CVD), plasma-enhanced chemical vapor deposition (PECVD), lamination or the like. Thereafter, portions of the bonding material outside the optical window OW are ground, so as to form a bonding layer 260. In some embodiments, the portions of the bonding material outside the optical window OW are removed by a mechanical grinding process, a chemical mechanical polishing (CMP) process, or other suitable processes. After the grinding process, a top surface 260S1 of the bonding layer 260 is substantially leveled with the top surface 243S1 of the dielectric layer 243a of the interconnect structure 240a. In some embodiments, a material of the bonding layer 260 may include silicon oxide, silicon nitride, silicon oxynitirde or other suitable dielectric materials.

Figure 6:
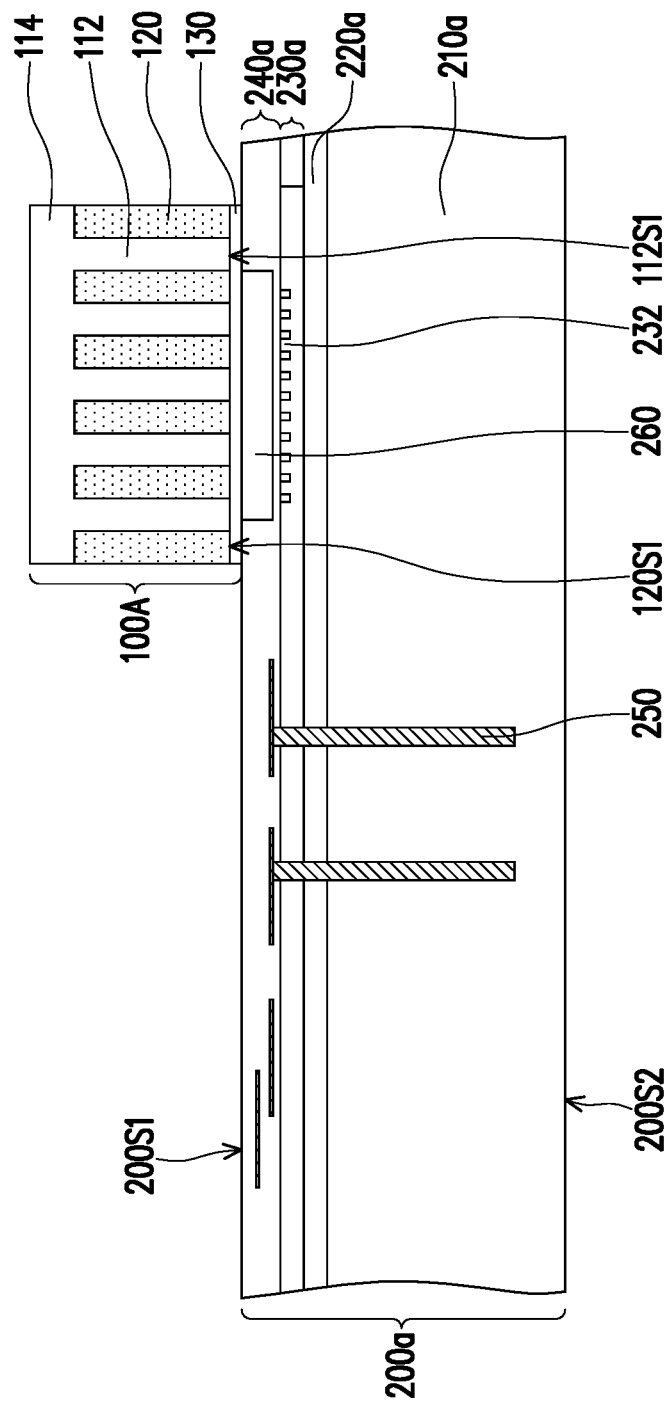

Referring to FIG. 5A and FIG. 6, the waveguide die 100A illustrated in FIGS. 1F and 1G is flipped over and pressed onto the bonding layer 260 of the semiconductor wafer 200a, such that the first surfaces 112S1 of the semiconductor pillar portions 112 and the first surface 120S1 of the dielectric layer 120 faces the front surface 200S1 of the semiconductor wafer 200a, and the bonding layer 130 of the waveguide die 100A is in contact with the bonding layer 260 of the semiconductor wafer 200a. In other words, the semiconductor pillar portions 112 are between the semiconductor base portion 114 and the semiconductor wafer 200a. A bonding process is performed to bond the waveguide die 100A to the semiconductor wafer 200a through fusion bonding, wherein the bonding layer 130 of the waveguide die 100A is bonded with the bonding layer 260 of the semiconductor wafer 200a. In other words, the waveguide die 100A are bonded to the semiconductor wafer 200a through the bonding layer 130 and the bonding layer 260. In some embodiments, a width of the waveguide die 100A is wider than a width of the bonding layer 260 of the semiconductor wafer 200a. In some alternative embodiments, a width of the waveguide die 100A is substantially equal to or less than a width of the bonding layer 260 of the semiconductor wafer 200a.

Figure 7:
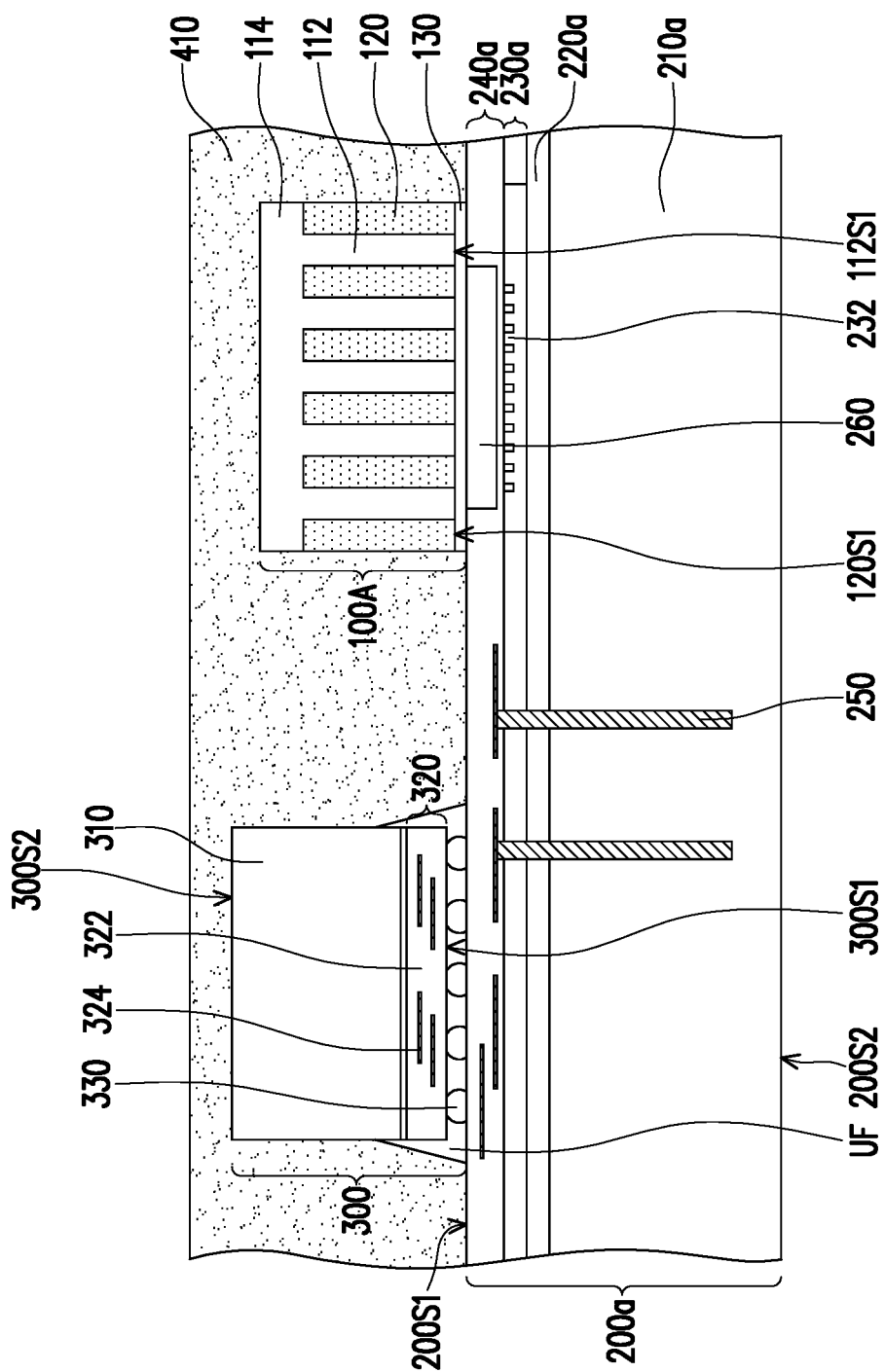

Referring to FIG. 6 and FIG. 7, an electric integrated circuit die 300 is provided over the semiconductor wafer 200a through a pick and place process. In some embodiments, the electric integrated circuit die 300 may be or may include logic dies (e.g., central processing unit, microcontroller, etc.), memory dies (e.g., dynamic random access memory (DRAM) dies, static random access memory (SRAM) dies, etc.), power management dies (e.g., power management integrated circuit (PMIC) dies), radio frequency (RF) dies, micro-electro-mechanical-system (MEMS) dies, signal processing dies (e.g., digital signal processing (DSP) dies), front-end dies (e.g., analog front-end (AFE) dies), system-on-chip (SoC) dies, or combinations thereof. The electric integrated circuit die 300 may include a semiconductor substrate 310 and an interconnect structure 320 over the semiconductor substrate 310. In some embodiments, the semiconductor substrate 310 may be or may include bulk silicon substrate, a silicon germanium substrate, or a substrate formed of other semiconductor materials. In some embodiments, the semiconductor substrate 310 may include other conductive layers or other semiconductor elements, such as transistors, diodes, resistors, capacitors or the like. In some embodiments, the interconnect structure 320 is electrically connected to the conductive layers or other semiconductor elements formed in the semiconductor substrate 310. The interconnect structure 320 formed on the semiconductor substrate 310 may include a dielectric layer 322 and interconnect wirings 324 embedded in the dielectric layer 322. In some embodiments, a material of the dielectric layer 322 may include silicon oxide, silicon nitride, silicon oxynitirde or other suitable dielectric materials. In some embodiments, the interconnect wirings 324 may be formed of copper, copper alloys or other suitable conductive material.

As illustrated in FIG. 7, the electric integrated circuit die 300 includes a front surface (active surface) 300S1 and a rear surface 300S2 opposite to the front surface 200S1. The front surface (active surface) 300S1 of the electric integrated circuit die 300 faces the front surface (active surface) 200S1 of the semiconductor wafer 200a, and the rear surface 300S2 of the electric integrated circuit die 300 faces up.

In some embodiments, the electric integrated circuit die 300 is mounted onto and electrically connected to the semiconductor wafer 200a through a plurality of electrical terminals 330. The electrical terminals 330 may be or may include micro bumps, ball grid array (BGA) connectors, solder balls, metal pillars, controlled collapse chip connection (C4) bumps, electroless nickel-electroless palladium-immersion gold (ENEPIG) formed bumps, or the like. Other possible forms and shapes of the electrical terminals 330 may be utilized according to design requirements. Besides, in some embodiments, an underfill UF may be formed between the electric integrated circuit die 300 and the semiconductor wafer 200a so as to laterally encapsulate the electrical terminals 330. The underfill UF may protect the electrical terminals 330 from fatigue and may enhance bonding reliability between the electric integrated circuit die 300 and the semiconductor wafer 200a. In some alternative embodiments, the formation of the underfill UF may be omitted.

As illustrated in FIG. 7, after the electric integrated circuit die 300 are provided over the semiconductor wafer 200a, an encapsulation material 410 is formed over the semiconductor wafer 200a to encapsulate the waveguide die 100A and the electric integrated circuit die 300. In some embodiments, the encapsulation material 410 is formed by a molding process to cover the waveguide die 100A and the electric integrated circuit die 300. For example, the encapsulation material 410 may be formed by a compression molding process, a transfer molding process, or the like. A curing process is optionally performed to harden the encapsulation material 410 for optimum protection. In some embodiments, the encapsulation material 410 includes a base material and filler particles distributed in the base material. In some embodiments, the material of the base material includes epoxy resins, phenolic resins or silicon-containing resins, or the like, and the material of the filler particles includes silica, alumina, zinc oxide, titanium dioxide, or the like. However, in some alternative embodiments, the encapsulation material 410 is formed by a deposition process, and the encapsulation material 410 includes silicon oxide, silicon nitride, silicon oxynitirde or other suitable dielectric materials.

Figure 8:
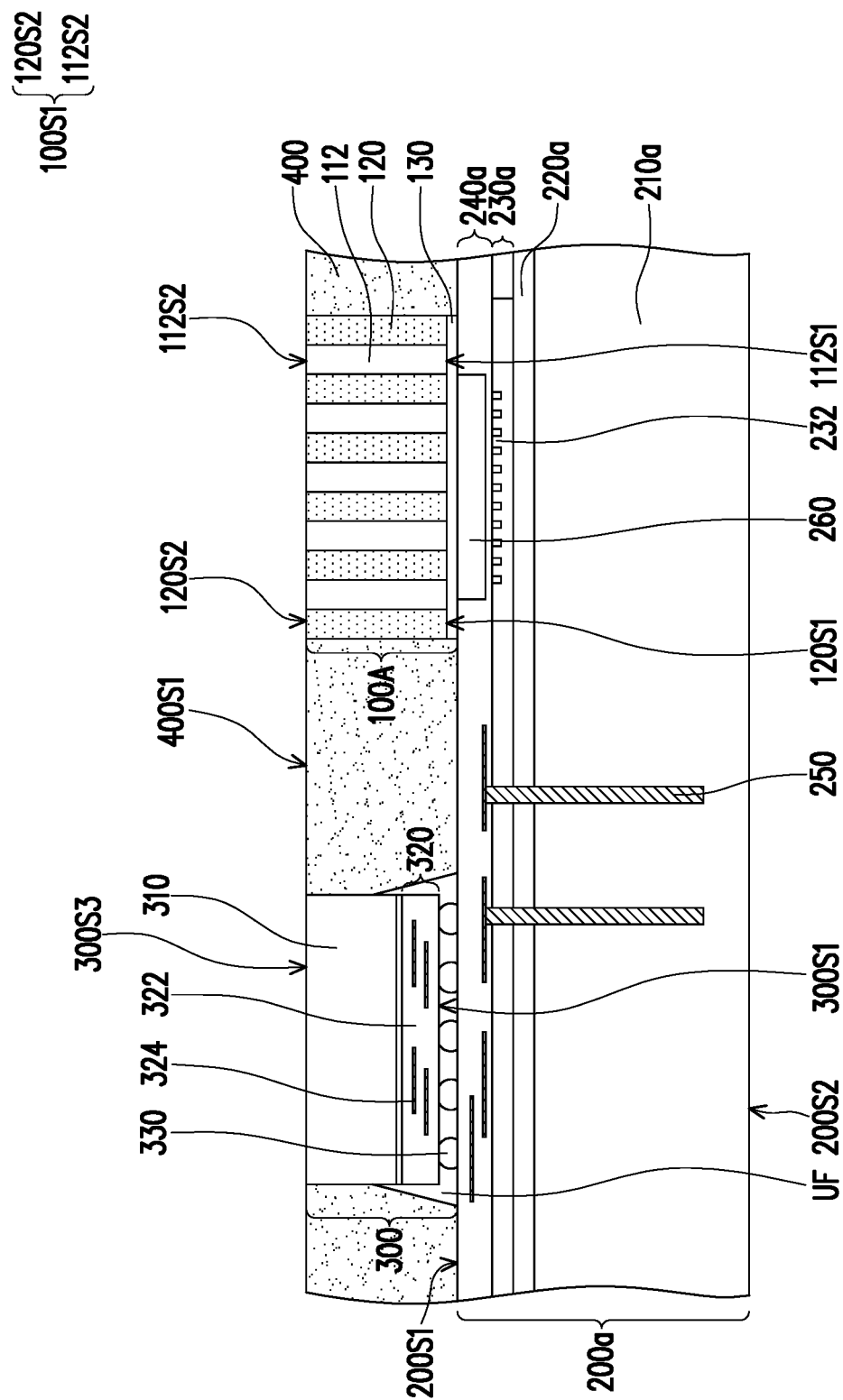

Referring to FIG. 7 and FIG. 8, the encapsulation material 410 is then ground to remove the semiconductor base portion 144 of the waveguide die 100A until the semiconductor pillar portions 112 are revealed, such that an insulating encapsulant 400 laterally encapsulating the electric integrated circuit die 300 and the waveguide die 100A is formed. In some embodiments, a portion of the encapsulation material 410 and the semiconductor base portion 144 of the waveguide die 100A are removed by a mechanical grinding process, a chemical mechanical polishing (CMP) process, or other suitable processes. In some embodiments, a portion of the semiconductor substrate 310 of the electric integrated circuit die 300 is ground as well. After the grinding process, a top surface 100S1 of the waveguide die 100A is substantially leveled with a rear surface 300S3 of the electric integrated circuit die 300 and a top surface 400S1 of the insulating encapsulant 400. In some embodiments, a second surface 120S2 of the dielectric layer 120 opposite to the first surface 120S1 and/or a second surface 112S2 of the semiconductor pillar portions 112 opposite to the first surface 112S1 are the top surface 100S1 of the waveguide die 100A may constitute the top surface 100S1 of the waveguide die 100A.

Figure 9:
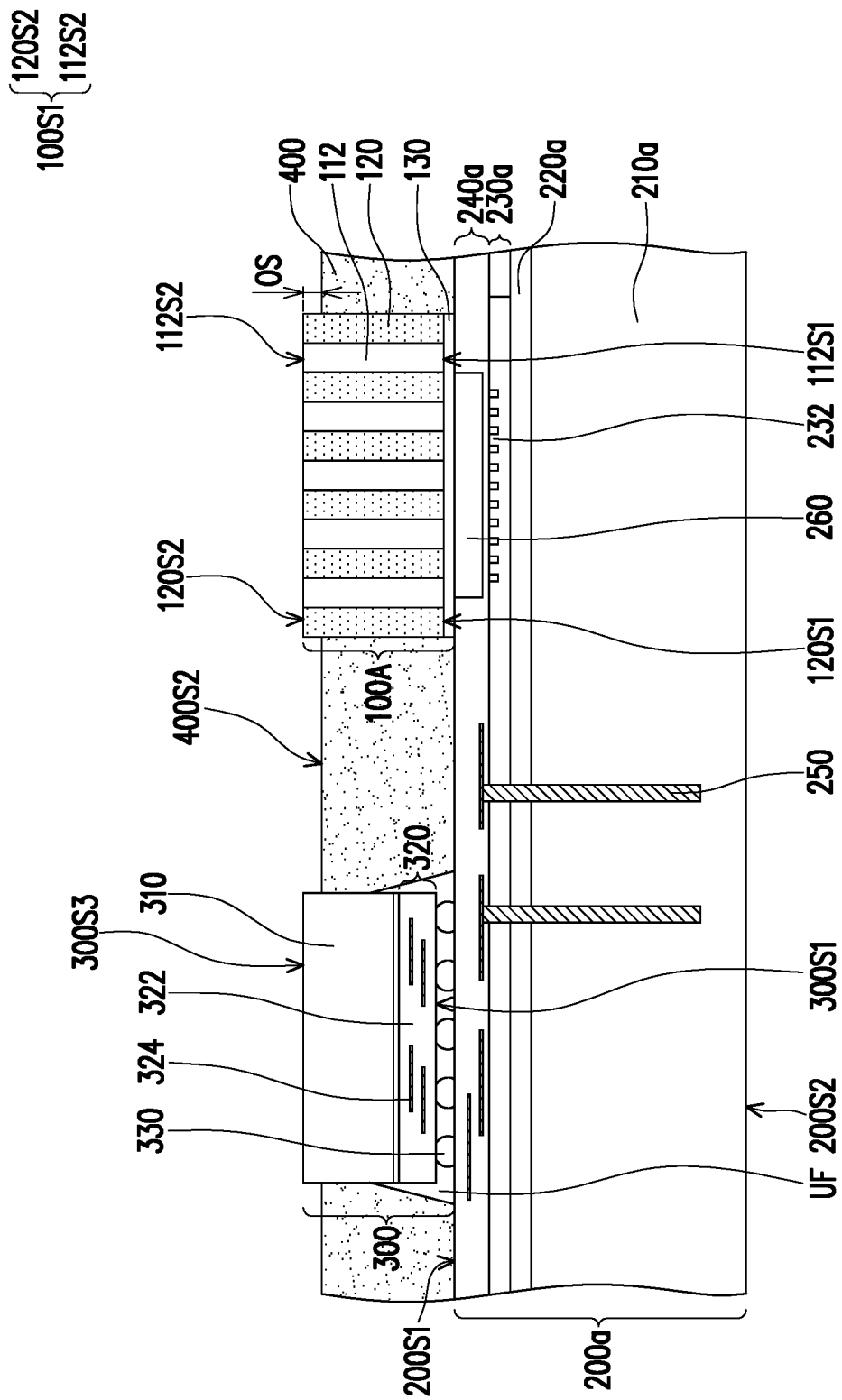

Referring to FIG. 8 and FIG. 9, after the insulating encapsulant 400 is formed, a recessing process is performed to remove a portion of the insulating encapsulant 400, such that a top surface 400S2 of the recessed insulating encapsulant 400 is lower than the rear surface 300S3 of the electric integrated circuit die 300 and the top surface 100S1 of the waveguide die 100A. In an embodiment where the insulating encapsulant 400 includes filler particles, a level height offset OS is between the top surface 100S1 of the waveguide die 100A and the top surface 400S2 of the recessed insulating encapsulant 400, such that the incident radiation may not be easily scattered by the filler particles of the insulating encapsulant 400, so as to reduce optical noise. In some embodiments, the level height offset OS may be greater than about 10 micrometers.

Figure 10:
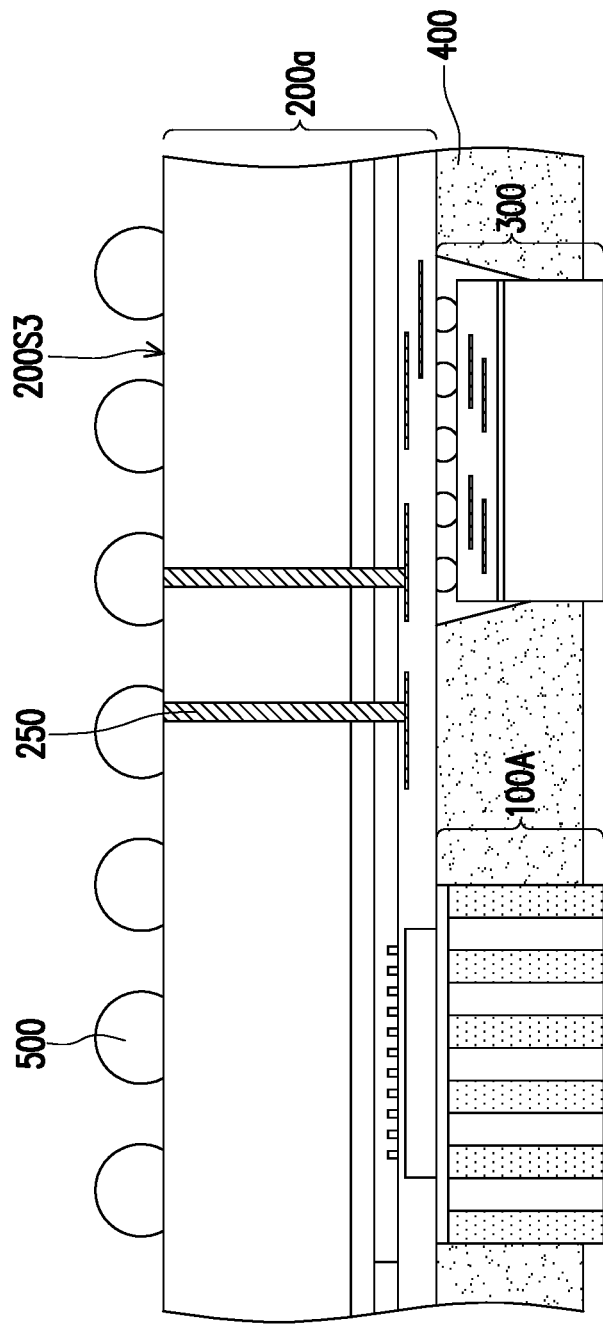

Referring to FIG. 9 and FIG. 10, the wafer-level package including the semiconductor wafer 200a, waveguide die 100A, the electric integrated circuit die 300 and the insulating encapsulant 400 is flipped over, and a back side grinding process is performed on the rear surface 200S2 of the semiconductor wafer 200a to remove a portion of the semiconductor substrate 210a of the semiconductor wafer 200a until bottom surfaces of the TSVs 250 are revealed. In some alternative embodiments, the semiconductor substrate 210a of the semiconductor wafer 200a may be ground by a mechanical grinding process, a chemical mechanical polishing (CMP) process, or other suitable processes. After the back side grinding process, bottom surfaces of the TSVs 250 may be substantially leveled with the rear surface 200S3 of the semiconductor wafer 200a.

After the bottom surfaces of the TSVs 250 are revealed, a plurality of electrical terminals 500 may be formed over the rear surface 200S3 of the semiconductor wafer 200a to be electrically connected to the TSVs 250 of the semiconductor wafer 200a. The electrical terminals 500 may be or may include micro bumps, ball grid array (BGA) connectors, solder balls, metal pillars, controlled collapse chip connection (C4) bumps, electroless nickel-electroless palladium-immersion gold (ENEPIG) formed bumps, or the like. Other possible forms and shapes of the electrical terminals 500 may be utilized according to design requirements. In some alternative embodiments, the electrical terminals 500 may be electrically connected to the TSVs 250 of the semiconductor wafer 200a through a redistribution circuit layer (not shown) between the semiconductor wafer 200a and the electrical terminals 500. The redistribution circuit layer (not shown) may include a plurality of dielectric layers and a plurality of redistribution layers stacked alternately. The number of the dielectric layers or the redistribution layers is not limited by the disclosure.

Figure 11:
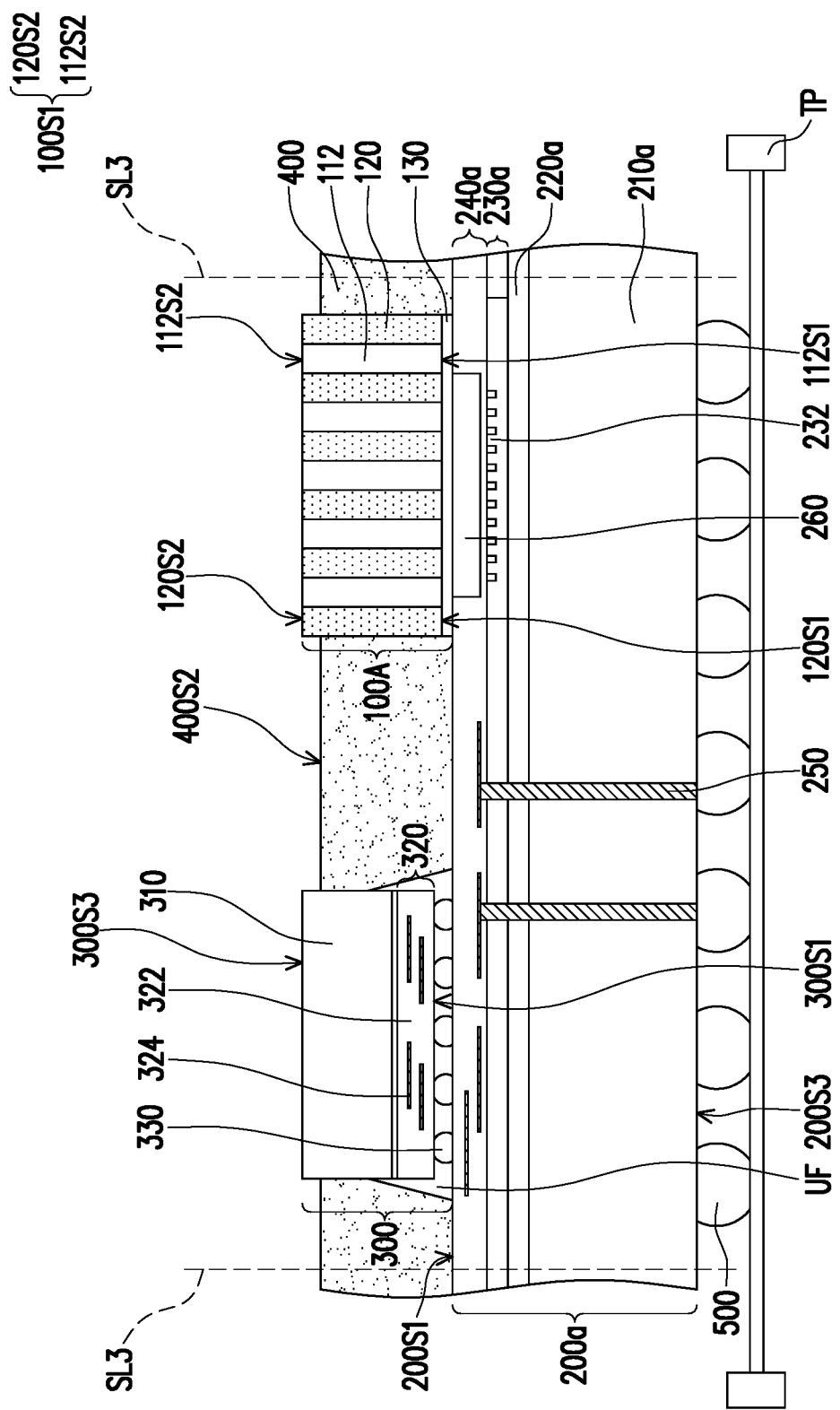

Referring to FIG. 10 and FIG. 11, after the electrical terminals 500 are formed, the wafer-level package including the semiconductor wafer 200a, waveguide die 100A, the electric integrated circuit die 300, the insulating encapsulant 400 and the electrical terminals 500 is flipped upside down and is placed on a tape TP.

Referring to FIG. 11 and FIG. 12, a wafer dicing process is performed along a scribe line SL3 to singulate the structure mounted on the tape TP. Thereafter, the diced structure is removed from the tape TP to form multiple singulated package structures 10. In some embodiments, the wafer dicing process is, for example, a laser cutting process, a mechanical cutting process, or other suitable processes. As illustrated in FIG. 12, each singulated package structure 10 includes the photoelectric integrated circuit die 200, the electric integrated circuit die 300, the waveguide die 100A and an insulating encapsulant 400. The electric integrated circuit die 300 is over and electrically connected to the photoelectric integrated circuit die 200. The waveguide die 100A is over and optically coupled to the photoelectric integrated circuit die 200. The insulating encapsulant 400 laterally encapsulates the electric integrated circuit die 300 and the waveguide die 100A. In some embodiments, the waveguide die 100A includes semiconductor pillar portions 112 and the dielectric layer 114. In some embodiments, the semiconductor pillar portions 112 are embedded in the dielectric layer 114. In some embodiments, the dielectric layer 114 is in contact with the insulating encapsulant 400. As shown in FIG. 11 and FIG. 12, the materials and the characteristics of a semiconductor substrate 210, a dielectric layer 220, a waveguide layer 230 and a redistribution structure 240 of the photoelectric integrated circuit die 200 in FIG. 12 are the same as those of the semiconductor substrate 210a, the dielectric layer 220a, the waveguide layer 230a and the redistribution structure 240a of the semiconductor wafer 200a in FIG. 11, and the detailed descriptions are omitted therein.

In some embodiments, the package structure 10 may be mounted on and electrically coupled to a package component 20. The package component 20 may be or may include a package substrate, a printed circuit board (PCB), a printed wiring board, an interposer, and/or other circuit carrier that is capable of carrying integrated circuits.

In some embodiments, the optical fiber OF optical coupled to the photoelectric integrated circuit die 200 of the package structure 10 is disposed over the top surface 100S1 of the waveguide die 100A. The optical fiber OF may be optical coupled to the grating coupler 232 of the photoelectric integrated circuit die 200 through the waveguide die 100A. As illustrated in FIG. 12, the semiconductor pillar portions 112 of the waveguide die 100A extend from the optical fiber OF to the photoelectric integrated circuit die 200, such that the semiconductor pillar portions 112 may guide the light from the optical fiber OF to the grating couplers 232 of the photoelectric integrated circuit die 200 and/or the light emitted out of the grating couplers 232 to the optical fiber OF. It is appreciated that the configuration of the optical fiber OF shown in FIG. 12 is schematic, and in some embodiments, a coupler (not shown) may be used to secure the optical fiber OF on the waveguide die 100A, and the coupler and the optical fiber OF may be attached to the waveguide die 100A through adhesive films, such as optical clear adhesive or other suitable optical glue/grease.

Figure 13:
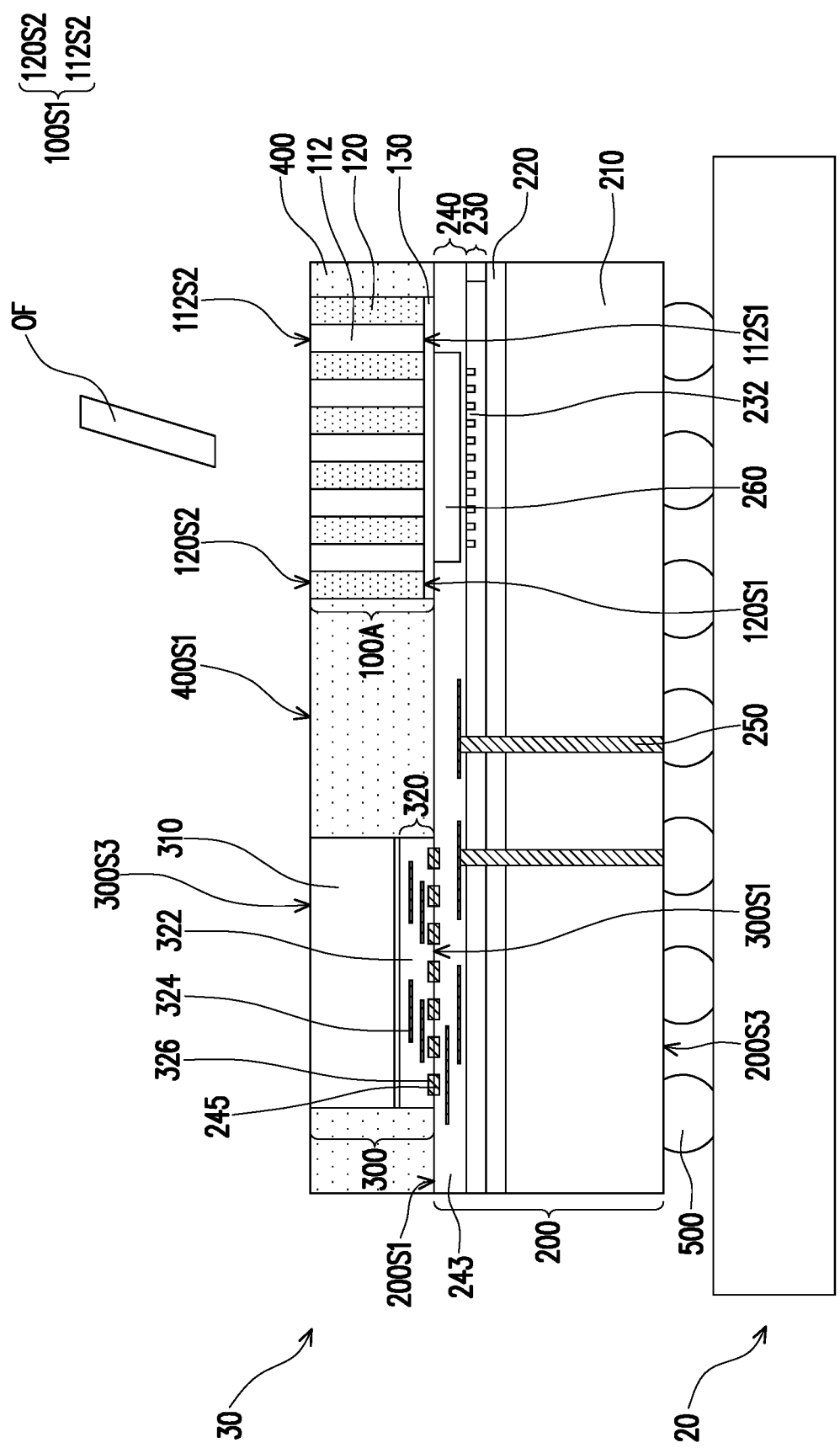

FIG. 13 is a cross-sectional view schematically illustrating a package in accordance with some other embodiments of the present disclosure. In FIG. 13, a package structure 30 is similar to the package structure 20 shown in FIG. 12, and the processes for forming the package structure 30 are similar to the processes for forming the package structure 20, so the detailed descriptions are omitted for the sake of brevity. In some embodiments, the electric integrated circuit die 300 is bonded to the photoelectric integrated circuit die 200 through hybrid bonding, wherein the dielectric layer 322 of the electric integrated circuit die 300 are bonded with the dielectric layer 243 of the photoelectric integrated circuit die 200, and metallic bonding pads 326 of the electric integrated circuit die 300 are bonded with metallic bonding pads 245 of the photoelectric integrated circuit die 200. The metallic bonding pads 326 of the electric integrated circuit die 300 are embedded in the dielectric layer 322 of the interconnect structure 320, and the metallic bonding pads 245 of the photoelectric integrated circuit die 200 are embedded in the dielectric layer 243 of the interconnect structure 240. In detail, the dielectric layer 322 of the electric integrated circuit die 300 and the dielectric layer 243 of the photoelectric integrated circuit die 200 are bonded by dielectric-to-dielectric bonding, while the metallic bonding pads 326 of the electric integrated circuit die 300 and the metallic bonding pads 245 of the photoelectric integrated circuit die 200 are bonded by metal-to-metal bonding.

Besides, in an embodiment where the insulating encapsulant 400 includes oxide-based materials and does not includes filler particles, the top surface 400S1 of the insulating encapsulant 400 may be substantially leveled with the top surface 100S1 of the waveguide die 100A and the rear surface 300S3 of the electric integrated circuit die 300. For example, the recessing process of the insulating encapsulant 400 may be omitted.

Figure 14:
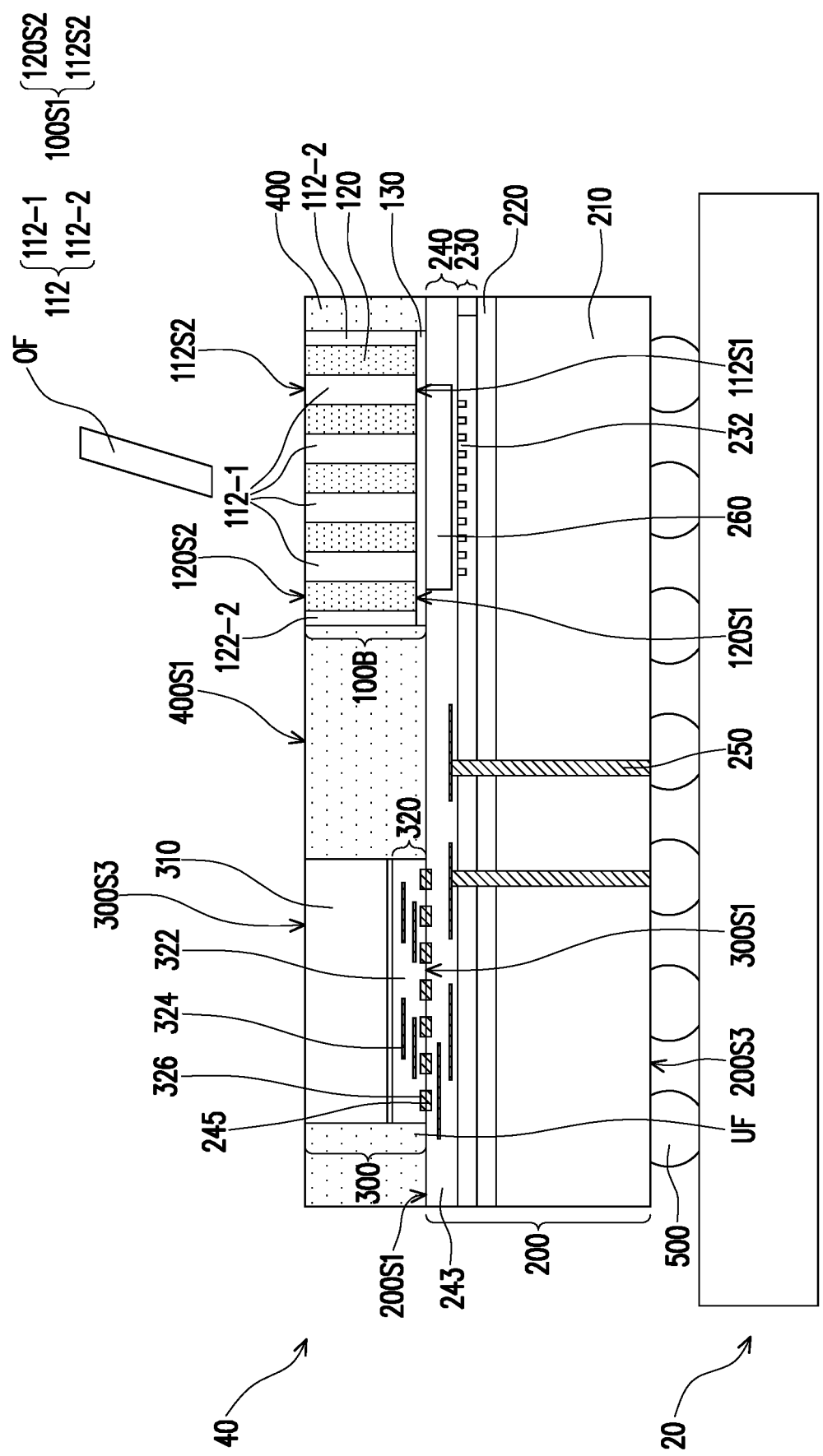

FIG. 14 is a cross-sectional view schematically illustrating a package in accordance with some other embodiments of the present disclosure. In FIG. 14, a package structure 40 is similar to the package structure 30 shown in FIG. 13, and the processes for forming the package structure 40 are similar to the processes for forming the package structure 30, so the detailed descriptions are omitted for the sake of brevity. In some embodiments, the waveguide die 100A may be replaced by the waveguide die 100B illustrated in FIGS. 2D and 2E. In some embodiments, the waveguide die 100B includes the plurality of semiconductor pillar portions 112 and a dielectric layer 114. In some embodiments, the semiconductor pillar portions 112 include the plurality of first semiconductor pillar portions 112-1 arranged in array and the second semiconductor pillar portion 112-2 encircling the first semiconductor pillar portions 112-1, wherein the first semiconductor pillar portions 112-1 are embedded in the dielectric layer 120 and are spaced apart from the second semiconductor pillar portion 112-2 by the dielectric layer 120. In some embodiments, the second semiconductor pillar portion 112-2 is in contact with the insulating encapsulant 400.

FIGS. 15 through 18 are cross-sectional views schematically illustrating a process flow for fabricating a package in accordance with some other embodiments of the present disclosure. In some embodiments, one integrated circuit die is shown to represent plural integrated circuit die of the semiconductor wafer.

Figure 17:
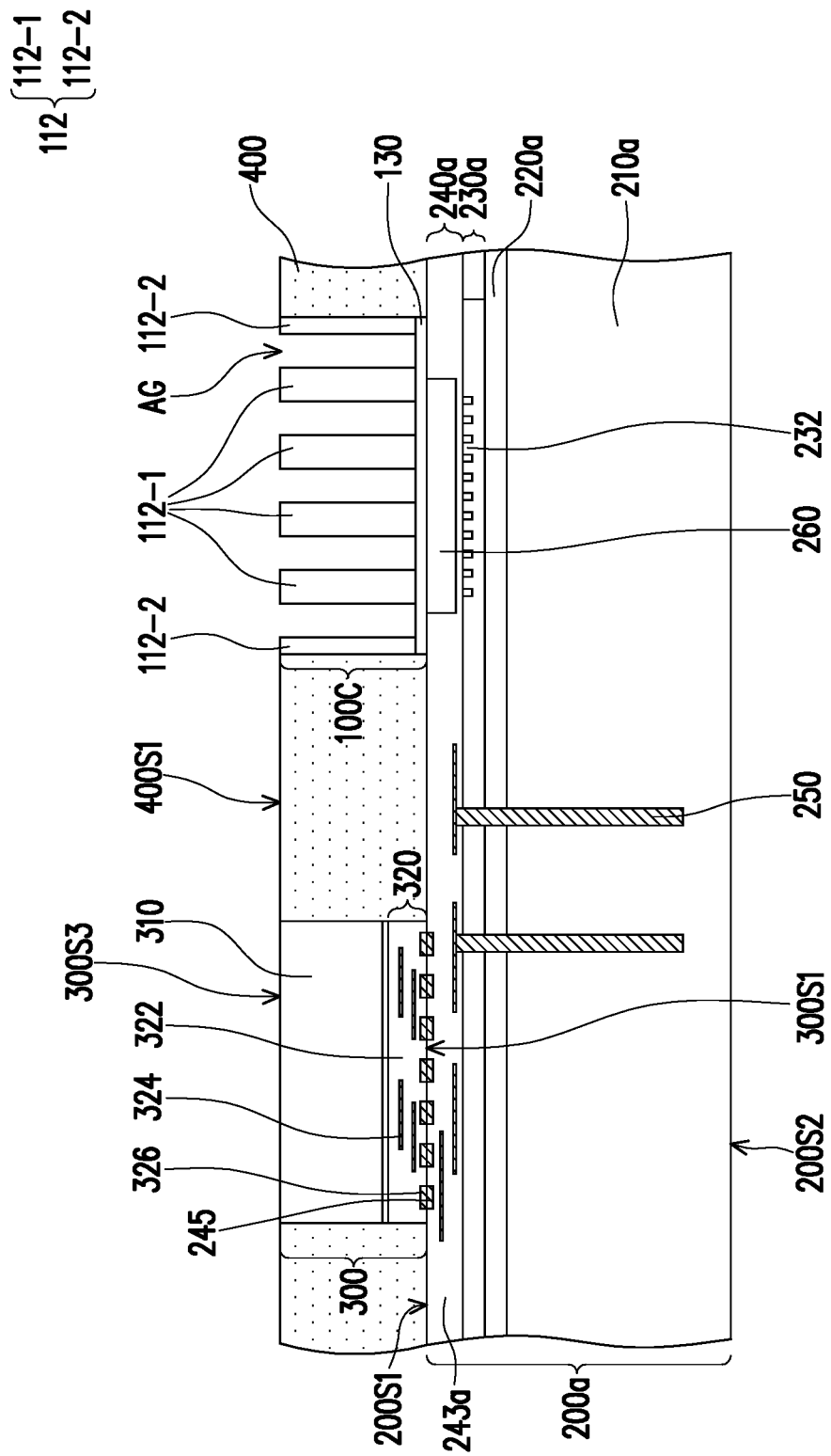
Figure 18:
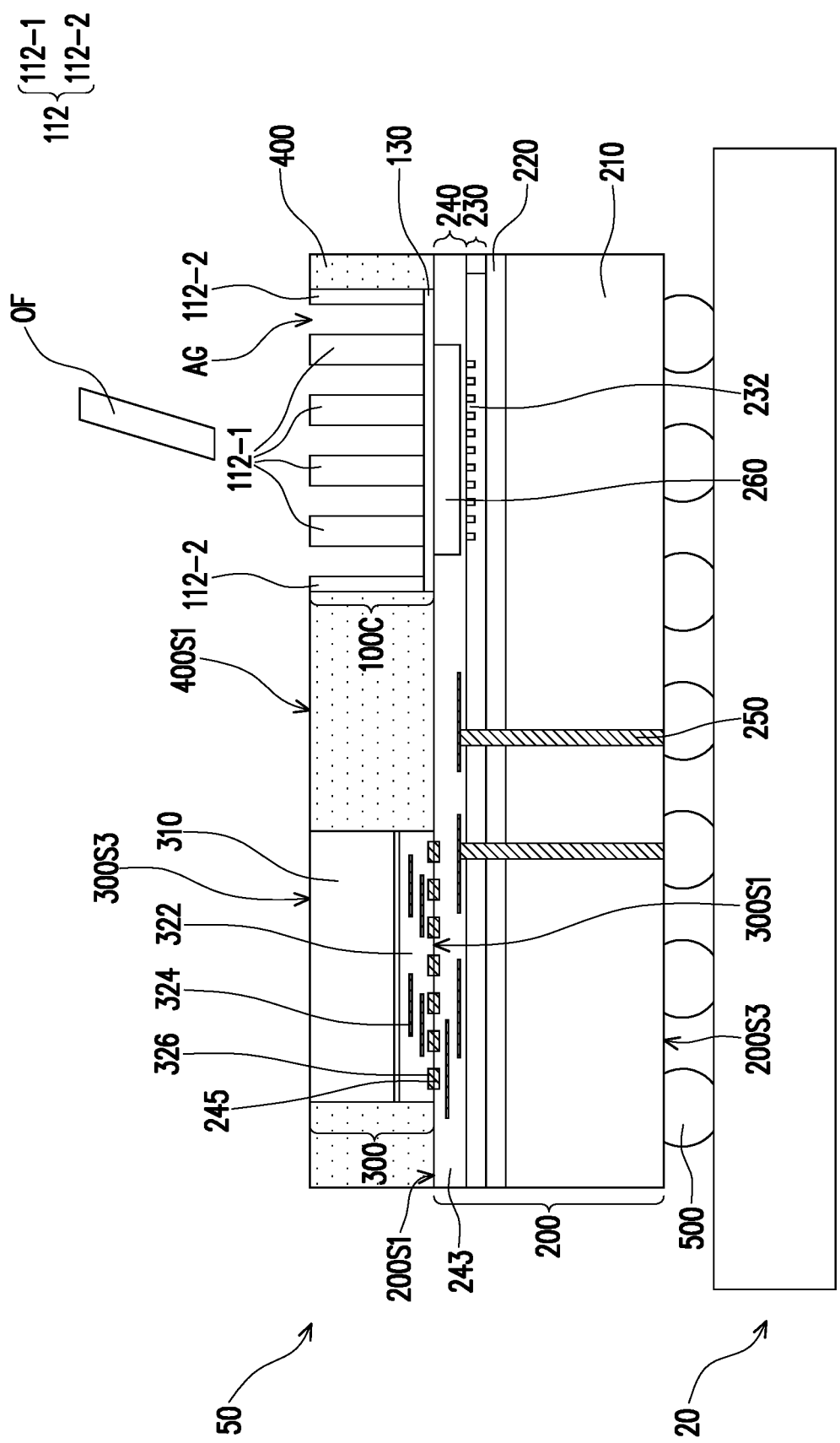

In some embodiments, a package structure 50 in FIG. 18 may be manufactured by performing processes similar to the steps illustrated in FIG. 3A to FIG. 12 except the alteration of the steps of forming the waveguide die. That is, the steps illustrated in FIG. 6 to FIG. 12 may be replaced by the steps illustrated in FIG. 15 to FIG. 18.

Figure 15:
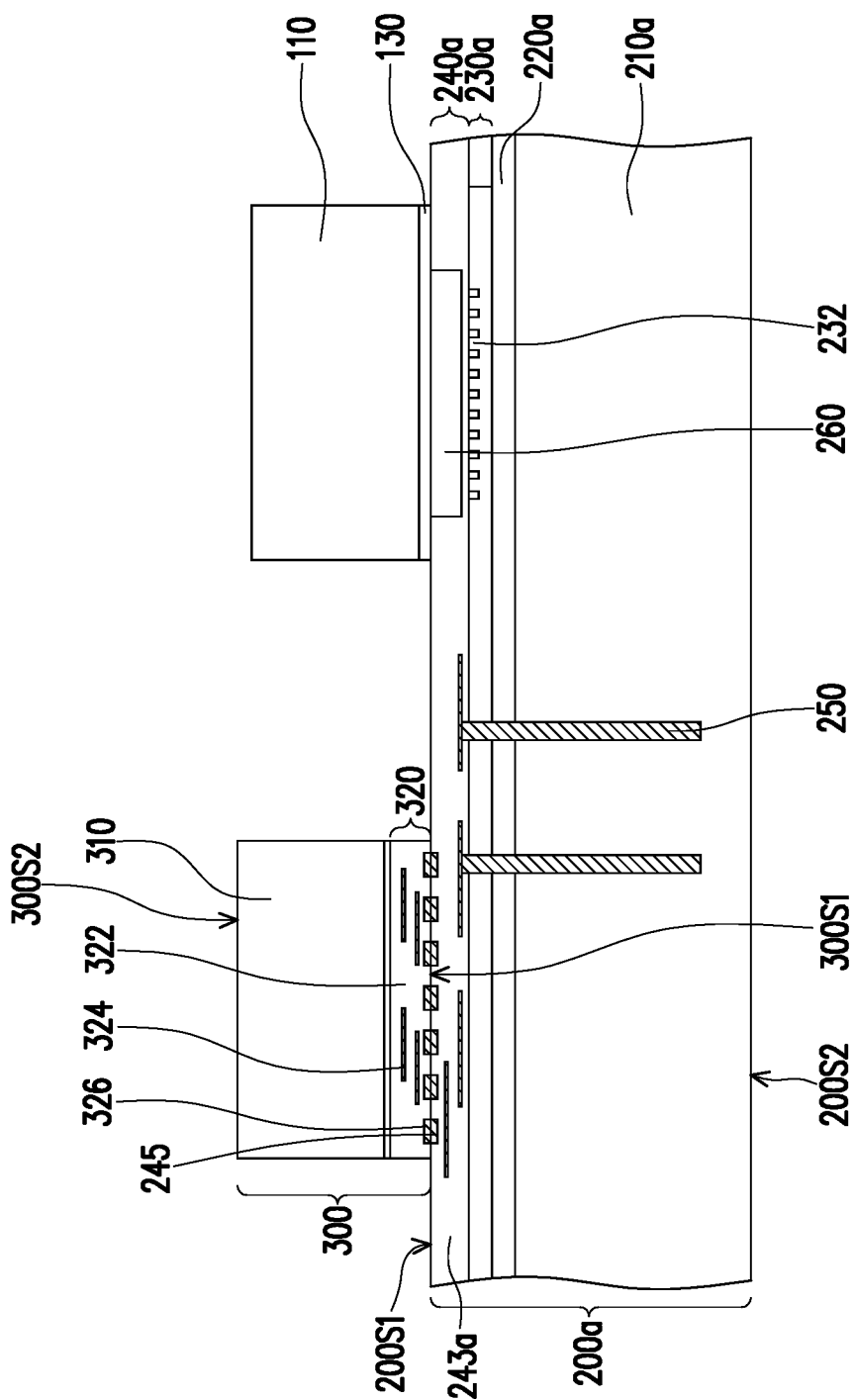

Referring to FIG. 15, the steps illustrated in FIGS. 3A, 4B and 5A may be performed. Thereafter, the electric integrated circuit die 300 and a semiconductor substrate 110 are provided over the semiconductor wafer 200a. In some embodiments, the semiconductor substrate 110 is bonded to the semiconductor wafer 200a through the bonding layer 130 which is formed on the semiconductor substrate 110. In some embodiments, the semiconductor substrate 110 may be or may include a bulk silicon substrate, a silicon germanium substrate, or a substrate formed of other semiconductor materials. In some embodiments, the electric integrated circuit die 300 is bonded to the semiconductor wafer 200a through hybrid bonding, wherein the dielectric layer 322 of the electric integrated circuit die 300 are bonded with the dielectric layer 243a of the semiconductor wafer 200a, and metallic bonding pads 326 of the electric integrated circuit die 300 are bonded with metallic bonding pads 245 of the semiconductor wafer 200a.

Figure 16:
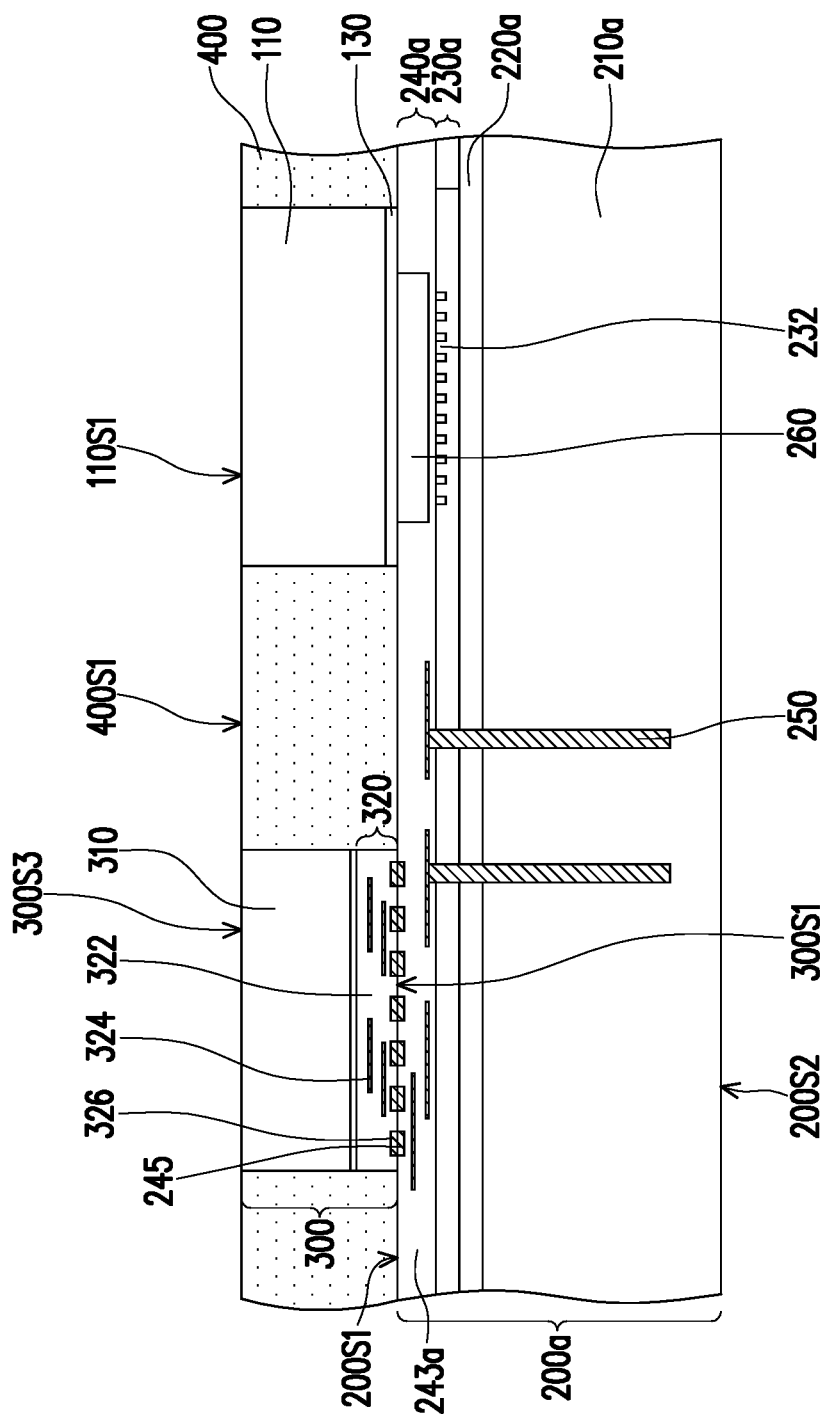

Referring to FIG. 15 and FIG. 16, after the electric integrated circuit die 300 and the semiconductor substrate 110 are provided over the semiconductor wafer 200a, an encapsulation material is formed over the semiconductor wafer 200a to encapsulate the semiconductor substrate 110 and the electric integrated circuit die 300. Thereafter, the encapsulation material is then ground until the electric integrated circuit die 300 and the semiconductor substrate 110 are revealed, such that an insulating encapsulant 400 laterally encapsulating the electric integrated circuit die 300 and the semiconductor substrate 110 is formed. In some embodiments, a portion of the encapsulation material is removed by a mechanical grinding process, a chemical mechanical polishing (CMP) process, or other suitable processes. In some embodiments, a portion of the semiconductor substrate 310 of the electric integrated circuit die 300 and a portion of the semiconductor substrate 110 are ground as well. After the grinding process, a top surface 110S1 of the semiconductor substrate 110 is substantially leveled with a rear surface 300S3 of the electric integrated circuit die 300 and a top surface 400S1 of the insulating encapsulant 400.

Referring to FIG. 16 and FIG. 17, after the insulating encapsulant 400 is formed over the semiconductor wafer 200a, the semiconductor substrate 110 is patterned to form a waveguide die 100C including a plurality of semiconductor pillar portions 112. The semiconductor pillar portions 112 include a plurality of first semiconductor pillar portions 112-1 arranged in array and a second semiconductor pillar portion 112-2 encircling the first semiconductor pillar portions 112-1. In some embodiments, the waveguide die 100C in FIG. 17 is similar to the waveguide die 100B in FIGS. 2D and 2E, except that the dielectric layer 120 of the waveguide die 100B in FIGS. 2D and 2E is replaced by, for example, air gaps AG. That is, the first semiconductor pillar portions 112-1 may be spaced apart from each other by the air gaps AG, and the first semiconductor pillar portions 112-1 may be spaced apart from the second semiconductor pillar portions 112-2 by the air gaps AG. In some embodiments, the semiconductor substrate 110 is patterned by photolithograph/etching process or other suitable patterning processes.

Referring to FIG. 17 and FIG. 18, after the semiconductor pillar portions 112 of the waveguide die 100C are formed, the process similar to the steps illustrated in FIGS. 10 to 12 may be repeated to obtain a package structure 50 mounted on the package component 20. In some embodiments, the package structure 50 in FIG. 18 is similar to the package structure 40 in FIG. 14, except that the dielectric layer 120 of the waveguide die 100B in FIG. 14 is replaced by, for example, air gaps AG, so the detailed descriptions are omitted therein.

In view of the above, in some embodiments of the disclosure, by disposing the waveguide die in the insulating encapsulant to guide the light transmitted between the photoelectric integrated circuit die and the overlying light source or optical signal source (e.g., optical fiber), lower optical loss may be achieved. The optical performance is accordingly improved.

In accordance with some embodiments of the disclosure, a structure adapted to optical coupled to an optical fiber includes a photoelectric integrated circuit die, an electric integrated circuit die, a waveguide die and an insulating encapsulant. The electric integrated circuit die is over and electrically connected to the photoelectric integrated circuit die. The waveguide die is over and optically coupled to the photoelectric integrated circuit die, wherein the waveguide die includes a plurality of semiconductor pillar portions extending from the optical fiber to the photoelectric integrated circuit die. The insulating encapsulant laterally encapsulates the electric integrated circuit die and the waveguide die.

In accordance with some embodiments of the disclosure, a method includes the following steps. An electric integrated circuit die and a waveguide die are provided over a photoelectric integrated circuit die, wherein the waveguide die includes a semiconductor base portion and a plurality of semiconductor pillar portions protruding from the semiconductor base portion, and the plurality of semiconductor pillar portions are between the semiconductor base portion and the photoelectric integrated circuit die. An encapsulation material is formed over the photoelectric integrated circuit die to encapsulate the electric integrated circuit die and the waveguide die. The encapsulation material and the waveguide die are ground to remove the semiconductor base portion until the plurality of semiconductor pillar portions are revealed, such that an insulating encapsulant laterally encapsulating the electric integrated circuit die and the waveguide die is formed.

In accordance with some embodiments of the disclosure, a method includes the following steps. An electric integrated circuit die and a semiconductor substrate are provided over a photoelectric integrated circuit die. An encapsulation material is formed over the photoelectric integrated circuit die to encapsulate the electric integrated circuit die and the semiconductor substrate. The semiconductor substrate is patterned to form a waveguide die including a plurality of semiconductor pillar portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure adapted to optical coupled to an optical fiber, the structure comprising:
   a photoelectric integrated circuit die comprising a first dielectric bonding layer;
   an electric integrated circuit die over and electrically connected to the photoelectric integrated circuit die;
   a waveguide die over and optically coupled to the photoelectric integrated circuit die, wherein the waveguide die comprises a plurality of semiconductor pillar portions extending from the optical fiber to the photoelectric integrated circuit die and a second dielectric bonding layer bonded to the first dielectric bonding layer and located between the plurality of semiconductor pillar portions and the first dielectric bonding layer; and
   an insulating encapsulant laterally encapsulating the electric integrated circuit die and the waveguide die.

2. The structure as claimed in claim 1, wherein the waveguide die further comprises a dielectric layer having a refractive index lower than that of the plurality of semiconductor pillar portions, the plurality of semiconductor pillar portions are embedded in the dielectric layer, and the second dielectric bonding layer is also located between the dielectric layer and the first dielectric bonding layer.

3. The structure as claimed in claim 2, wherein the dielectric layer is in contact with the insulating encapsulant.

4. The structure as claimed in claim 1, wherein the plurality of semiconductor pillar portions comprise first semiconductor pillar portions arranged in array and a second semiconductor pillar portion encircling the first semiconductor pillar portions, and the second semiconductor pillar portion is in contact with the insulating encapsulant.

5. The structure as claimed in claim 4, wherein the waveguide die further comprises a dielectric layer having a refractive index lower than that of the plurality of semiconductor pillar portions, the first semiconductor pillar portions are embedded in the dielectric layer and spaced apart from the second semiconductor pillar portion by the dielectric layer, and the second dielectric bonding layer is also located between the dielectric layer and the first dielectric bonding layer.

6. The structure as claimed in claim 1, wherein the photoelectric integrated circuit die further comprises:
a semiconductor substrate; and
an interconnect structure over the semiconductor substrate, wherein the interconnect structure comprises an optical window allowing optical transmission between the waveguide die and the photoelectric integrated circuit die.

7. The structure as claimed in claim 6, wherein the first dielectric bonding layer is in the optical window.

8. The structure as claimed in claim 1, wherein a top surface of the insulating encapsulant is lower than a top surface of the waveguide die.

9. The structure as claimed in claim 1, wherein a top surface of the insulating encapsulant is substantially leveled with a top surface of the waveguide die.

10. A structure adapted to optical coupled to an optical fiber, the structure comprising:
a photoelectric integrated circuit die comprising an optical window and a first dielectric bonding layer filling the optical window;
an electric integrated circuit die over and electrically connected to the photoelectric integrated circuit die;
a waveguide die over and optically coupled to the photoelectric integrated circuit die, wherein the waveguide die comprises a plurality of semiconductor pillar portions extending from the optical fiber to the photoelectric integrated circuit die and a second dielectric bonding layer bonded to the first bonding layer of the photoelectric integrated circuit die and located between the plurality of semiconductor pillar portions and the first dielectric bonding layer; and
an insulating encapsulant laterally encapsulating the electric integrated circuit die and the waveguide die.

11. The structure as claimed in claim 10, wherein a material of each of the first dielectric bonding layer and the second dielectric bonding layer comprises silicon oxide, silicon nitride, or silicon oxynitride.

12. The structure as claimed in claim 10, wherein the first dielectric bonding layer is in contact with the second dielectric bonding layer.

13. The structure as claimed in claim 10, wherein the plurality of semiconductor pillar portions are in contact with the second dielectric bonding layer.

14. The structure as claimed in claim 10, wherein an extension direction of the plurality of semiconductor pillar portions is inclined with respect to an extension direction of the optical fiber.

15. The structure as claimed in claim 10, wherein the waveguide die further comprises a dielectric layer having a refractive index lower than that of the plurality of semiconductor pillar portions, and the plurality of semiconductor pillar portions are embedded in the dielectric layer and in contact with the second dielectric bonding layer.

16. The structure as claimed in claim 15, wherein a thickness of the dielectric layer equals to a thickness of each of the plurality of semiconductor pillar portions.

17. A structure adapted to optical coupled to an optical fiber, the structure comprising:
a photoelectric integrated circuit die comprising a first dielectric bonding layer;
an electric integrated circuit die over and electrically connected to the photoelectric integrated circuit die;
a waveguide die over and optically coupled to the photoelectric integrated circuit die and located between the photoelectric integrated circuit die and the optical fiber, wherein the waveguide die comprises a plurality of semiconductor pillar portions extending from the optical fiber to the photoelectric integrated circuit die and a second dielectric bonding layer in contact with the plurality of semiconductor pillar portions, wherein the second dielectric bonding layer is located between the plurality of semiconductor pillar portions and the first dielectric bonding layer and bonded the first dielectric bonding layer; and
an insulating encapsulant laterally encapsulating the electric integrated circuit die and the waveguide die.

18. The structure as claimed in claim 17, wherein an area of an orthogonal projection of the second dielectric bonding layer on the photoelectric integrated circuit die is greater than a total area of orthogonal projections of the plurality of semiconductor pillar portions on the photoelectric integrated circuit die.

19. The structure as claimed in claim 17, wherein a material of the second dielectric bonding layer comprises silicon oxide, silicon nitride, or silicon oxynitride.

20. The structure as claimed in claim 19, wherein an extension direction of the plurality of semiconductor pillar portions is inclined with respect to an extension direction of the optical fiber.

* * * * *